(12) United States Patent
Yoon et al.

(10) Patent No.: US 12,279,537 B2
(45) Date of Patent: Apr. 15, 2025

(54) SEMICONDUCTOR MEMORY DEVICES AND METHODS FOR FABRICATING THE SAME

(71) Applicant: Samsung Electronics Co., Ltd., Suwon-si (KR)

(72) Inventors: Hye Ji Yoon, Hwaseong-si (KR); O Ik Kwon, Yongin-si (KR); Yun Seung Kang, Seoul (KR); Sang-Kuk Kim, Seongnam-si (KR); Gwang-Hyun Baek, Seoul (KR); Tae Hyung Lee, Hwaseong-si (KR); Su Jin Jeon, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 472 days.

(21) Appl. No.: 17/468,739

(22) Filed: Sep. 8, 2021

(65) Prior Publication Data

US 2022/0216402 A1  Jul. 7, 2022

(30) Foreign Application Priority Data

Jan. 6, 2021 (KR) .................. 10-2021-0001206

(51) Int. Cl.
*H10N 70/00* (2023.01)
*H01L 23/528* (2006.01)
(Continued)

(52) U.S. Cl.
CPC ....... *H10N 70/841* (2023.02); *H01L 23/5283* (2013.01); *H10B 63/24* (2023.02);
(Continued)

(58) Field of Classification Search
CPC .................................................. H10N 70/231
See application file for complete search history.

(56) References Cited

U.S. PATENT DOCUMENTS 10,748,966 B2  8/2020  Mayuzumi et al.
2013/0256624 A1*  10/2013  Kau ................. H10N 70/841
257/4
(Continued)

FOREIGN PATENT DOCUMENTS

KR  100805843 B1  2/2008
KR  100900225 B1  6/2009
(Continued)

*Primary Examiner* — Mounir S Amer
(74) *Attorney, Agent, or Firm* — Myers Bigel, P.A.

(57) ABSTRACT

A semiconductor memory device in which performance is improved by reducing a wiring resistance is provided. The semiconductor memory device comprising an inter-wiring insulation film on a substrate, a first wiring pattern extending in a first direction, in the inter-wiring insulation film, a barrier insulation film that is on an upper surface of the inter-wiring insulation film, a barrier conductive pattern electrically connected to the first wiring pattern, in the barrier insulation film, a memory cell electrically connected to the barrier conductive pattern and including a selection pattern and a variable resistor pattern, and a second wiring pattern extending in a second direction intersecting the first direction, on the memory cell, wherein a width of the barrier conductive pattern in the second direction is different from a width in the second direction of a portion of the memory cell that is adjacent to the barrier conductive pattern.

20 Claims, 17 Drawing Sheets

(51) Int. Cl.
  *H10B 63/00*    (2023.01)
  *H10N 70/20*    (2023.01)
(52) U.S. Cl.
  CPC .......... *H10B 63/84* (2023.02); *H10N 70/011* (2023.02); *H10N 70/231* (2023.02)

(56) References Cited

U.S. PATENT DOCUMENTS

| | | | | |
|---|---|---|---|---|
| 2014/0313379 | A1* | 10/2014 | Mackey | H04N 25/134 |
| | | | | 438/70 |
| 2017/0117328 | A1* | 4/2017 | Terai | H10N 70/231 |
| 2020/0243763 | A1* | 7/2020 | Komatsu | G11C 13/0004 |
| 2021/0217812 | A1* | 7/2021 | Hsiao | H10B 61/00 |
| 2021/0328139 | A1* | 10/2021 | Lee | H10N 70/8828 |

FOREIGN PATENT DOCUMENTS

| | | | |
|---|---|---|---|
| KR | 20170089633 | A | 8/2017 |
| KR | 20170107203 | A | 9/2017 |
| KR | 20170109793 | A | 10/2017 |
| KR | 20200018133 | A | 2/2020 |
| KR | 20200042837 | A | 4/2020 |
| KR | 20200076445 | A | 6/2020 |
| KR | 20200092759 | A | 8/2020 |

* cited by examiner

SEMICONDUCTOR MEMORY DEVICES AND METHODS FOR FABRICATING THE SAME

CROSS-REFERENCE TO RELATED APPLICATION

This application claims priority from Korean Patent Application No. 10-2021-0001206, filed on Jan. 6, 2021 in the Korean Intellectual Property Office, and all the benefits accruing therefrom under 35 U.S.C. 119, the entire contents of which are herein incorporated by reference.

BACKGROUND

The present disclosure relates to semiconductor memory devices. As semiconductor memory devices have become more highly integrated, demand has increased for high-performance memory devices having a rapid operation, a low operating voltage, and the like. Recently, variable resistor memory devices having variable resistor properties have been developed as new memory devices. For example, a phase change random access memory (PRAM) device, a magnetic random access memory (MRAM) device, a resistive random access memory (RRAM) device, and the like are being studied as variable resistor memory devices.

SUMMARY

Aspects of the present disclosure provide a semiconductor memory device in which performance is improved by reducing a wiring resistance.

Aspects of the present disclosure also provide a method for fabricating a semiconductor memory device in which performance is improved by reducing a wiring resistance.

According to an aspect of the present disclosure, there is provided a semiconductor memory device comprising an inter-wiring insulation film on a substrate, a first wiring pattern extending in a first direction, in the inter-wiring insulation film, a barrier insulation film that is on an upper surface of the inter-wiring insulation film, a barrier conductive pattern electrically connected to the first wiring pattern, in the barrier insulation film, a memory cell electrically connected to the barrier conductive pattern and including a selection pattern and a variable resistor pattern, and a second wiring pattern extending in a second direction intersecting the first direction, on the memory cell, wherein a width of the barrier conductive pattern in the second direction is different from a width in the second direction of a portion of the memory cell that is adjacent to the barrier conductive pattern.

According to another aspect of the present disclosure, there is provided a semiconductor memory device comprising an inter-wiring insulation film on a substrate, a first wiring pattern extending in a first direction, in the inter-wiring insulation film, a barrier insulation film that is on an upper surface of the inter-wiring insulation film, a barrier conductive pattern electrically connected to the first wiring pattern, in the barrier insulation film, a memory cell including a selection pattern and a variable resistor pattern, on the barrier conductive pattern, a protective film that extends along an upper surface of the barrier insulation film and side surfaces of the memory cell, and a second wiring pattern that extends in a second direction intersecting the first direction, on the memory cell.

According to another aspect of the present disclosure, there is provided a semiconductor memory device comprising a first word line and a second word line that are on a substrate and each extend in a first direction, where the first word line is between the second word line and the substrate, a bit line that extends in a second direction intersecting the first direction, between the first word line and the second word line, a first barrier conductive pattern electrically connected to an upper surface of the first word line, a first barrier insulation film that surrounds side surfaces of the first barrier conductive pattern, a first memory cell that electrically connects the first barrier conductive pattern and the bit line, on an upper surface of the first barrier conductive pattern and an upper surface of the first barrier insulation film, a second barrier conductive pattern electrically connected to an upper surface of the bit line, a second barrier insulation film that surrounds side surfaces of the second barrier conductive pattern, and a second memory cell that electrically connects the second barrier conductive pattern and the second word line, on an upper surface of the second barrier conductive pattern and an upper surface of the second barrier insulation film, wherein each of the first memory cell and the second memory cell includes a selection pattern having ovonic threshold switching (OTS) properties and a phase change pattern in which resistance changes depending on a phase change.

According to another aspect of the present disclosure, there is provided a method for fabricating a semiconductor memory device, the method comprising forming a first inter-wiring insulation film and a first wiring pattern extending in a first direction in the first inter-wiring insulation film, on a substrate, forming a first barrier insulation film that is on an upper surface of the first inter-wiring insulation film, forming a first barrier conductive pattern electrically connected to the first wiring pattern, in the first barrier insulation film, forming a first memory cell including a first selection pattern and a first variable resistor pattern, on the first barrier insulation film and the first barrier conductive pattern, and forming a second inter-wiring insulation film, and a second wiring pattern extending in a second direction intersecting the first direction in the second inter-wiring insulation film, on the first memory cell.

However, aspects of the present disclosure are not restricted to the one set forth herein. The above and other aspects of the present disclosure will become more apparent to one of ordinary skill in the art to which the present disclosure pertains by referencing the detailed explanation of the present disclosure given below.

BRIEF DESCRIPTION OF THE DRAWINGS

Aspects and features of the present disclosure will become more apparent by describing in detail example embodiments thereof referring to the attached drawings, in which.

DETAILED DESCRIPTION

Hereinafter, a semiconductor memory device according to example embodiments will be described referring to FIGS. 1 to 9.

Figure 1:
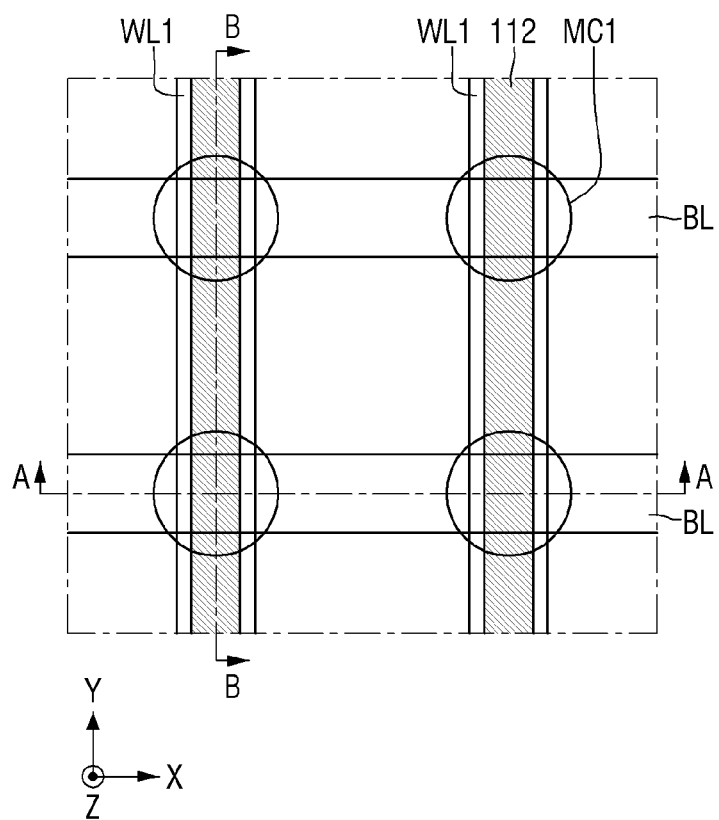
FIG. 1 is a schematic layout diagram for explaining a semiconductor memory device according to some embodiments.
Figure 2:
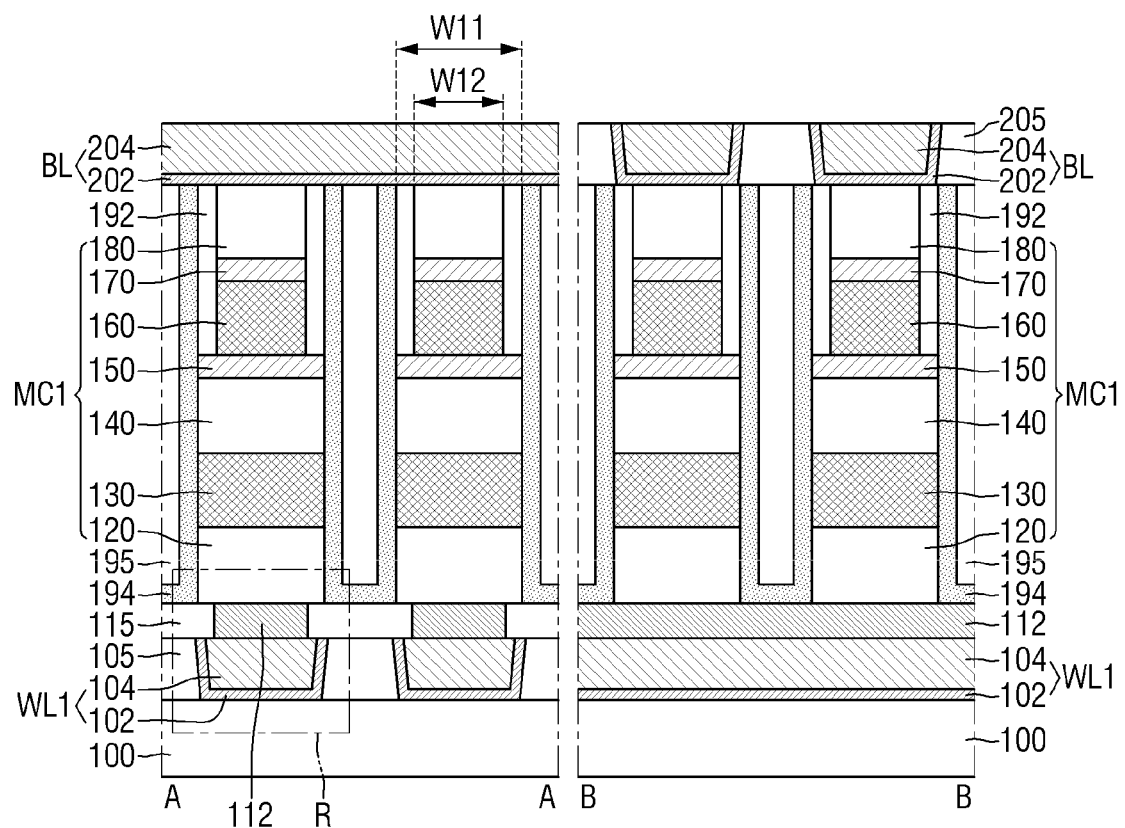
FIG. 2 is a schematic cross-sectional view taken along lines A-A and B-B of FIG. 1.

FIG. 1 is a schematic layout diagram for explaining the semiconductor memory device according to some embodiments. FIG. 2 is a schematic cross-sectional view taken along lines A-A and B-B of FIG. 1. FIGS. 3A to 3D are various enlarged views for explaining a region R of FIG. 2.

Referring to FIGS. 1 to 3D, a semiconductor memory device according to some embodiments includes a substrate 100, a first inter-wiring insulation film 105, a first wiring pattern WL1, and a first barrier insulation film 115, a first barrier conductive pattern 112, a first memory cell MC1, a capping film 194, a gap fill film 195, a second inter-wiring insulation film 205, and a second wiring pattern BL.

The substrate 100 may be a semiconductor substrate. For example, the substrate 100 may be bulk silicon or SOI (silicon-on-insulator). The substrate 100 may be a silicon substrate or may include other materials, for example, silicon germanium, indium antimonide, lead tellurium compounds, indium arsenide, indium phosphide, gallium arsenide or gallium antimonide. Alternatively, the substrate 100 may have an epitaxial layer formed on a base substrate.

The first inter-wiring insulation film 105 may be formed on the substrate 100. Though the first inter-wiring insulation film 105 is only shown to be on (e.g., to cover) the upper surface of the substrate 100, this is just an example. As another example, of course, another insulation film may be interposed between the substrate 100 and the first inter-wiring insulation film 105. The first inter-wiring insulation film 105 may include, but is not limited to, for example, at least one of silicon oxide, silicon nitride, silicon oxynitride, and a combination thereof. As an example, the first inter-wiring insulation film 105 may include a silicon oxide.

The first wiring pattern WL1 may be formed in the first inter-wiring insulation film 105. The plurality of first wiring patterns WL1 may be spaced apart from each other and extend side by side. For example, the plurality of first wiring patterns WL1 may extend in a first direction Y parallel to an upper surface of the substrate 100, respectively. The first inter-wiring insulation film 105 may electrically separate the plurality of first wiring patterns WL1. The first wiring pattern WL1 may function as a first word line of the semiconductor memory device according to some embodiments.

The first wiring pattern WL1 may include, but is not limited to, at least one of tungsten (W), tungsten nitride (WN), gold (Au), silver (Ag), copper (Cu), aluminum (Al), titanium aluminum nitride (TiAlN), nickel (Ni), cobalt (Co), chromium (Cr), tin (Sn), zinc (Zn), indium tin oxide (ITO), and combinations thereof. Preferably, the first wiring pattern WL1 may include copper (Cu).

In some embodiments, the first wiring pattern WL1 may include a first barrier conductive film 102 and a first filling conductive film 104. The first barrier conductive film 102 may be interposed between the first inter-wiring insulation film 105 and the first filling conductive film 104. For example, a trench extending in the first direction Y may be formed in the first inter-wiring insulation film 105. The first barrier conductive film 102 may conformally extend along a profile of the trench. The first filling conductive film 104 may fill a region of the trench that remains after the first barrier conductive film 102 is formed.

The first barrier conductive film 102 may impede/prevent elements (e.g., copper (Cu)) contained in the first filling conductive film 104 from being diffused into the first inter-wiring insulation film 105. As an example, the first filling conductive film 104 may include copper (Cu), and the first barrier conductive film 102 may include at least one of titanium (Ti), titanium nitride (TiN), tantalum (Ta), and tantalum nitride (TaN). As an example, the first barrier conductive film 102 may include titanium nitride (TiN).

In some embodiments, the first wiring pattern WL1 may be formed by a damascene process. In some embodiments, a width of the first wiring pattern WL1 (e.g., a width W21 of FIG. 3A) may decrease toward the substrate 100. Here, the width W21 of the first wiring pattern WL1 means a width in a second direction X that intersects a direction in which the first wiring pattern WL1 extends (that is, the first direction Y). This may be due to the properties of the etching process of forming a trench in the first inter-wiring insulation film 105 to form the first wiring pattern WL1.

In some embodiments, the width W21 of the first wiring pattern WL1 may be about 50 nanometers (nm) or less. As an example, the width W21 of the first wiring pattern WL1 may be about 5 nm to about 30 nm. Preferably, the width W21 of the first wiring pattern WL1 may be about 15 nm to about 25 nm.

In some embodiments, a height of the first wiring pattern WL1 (e.g., a height H1 of FIG. 3A) may be about 500 angstroms (Å) or less. As an example, the height H1 of the first wiring pattern WL1 may be about 50 Å to about 300 Å. Preferably, the height H1 of the first wiring pattern WL1 may be about 100 Å to about 200 Å.

The first barrier insulation film 115 may be formed on the first inter-wiring insulation film 105 and the first wiring pattern WL1. The first barrier insulation film 115 may be on (e.g., may cover) the upper surface of the first inter-wiring insulation film 105. In some embodiments, the first barrier insulation film 115 may be on (e.g., may cover) a part of the upper surface of the first wiring pattern WL1.

The first barrier insulation film 115 may protect the first wiring pattern WL1 by impeding/preventing the first wiring pattern WL1 from being oxidized. Further, the first barrier insulation film 115 may impede/prevent an element (e.g., copper (Cu)) contained in the first wiring pattern WL1 from being diffused into the first memory cell MC1. As an example, the first barrier insulation film 115 may include at least one of silicon nitride (SiN), silicon carbonitride (SiCN), and aluminum nitride (AlN). As an example, the first barrier insulation film 115 may include silicon nitride.

The first barrier conductive pattern 112 may be formed in the first barrier insulation film 115. The first barrier conductive pattern 112 may be connected to the first wiring pattern WL1. For example, the first barrier conductive pattern 112 may penetrate the first barrier insulation film 115 and come into contact with the upper surface of the first wiring pattern WL1. That is, the first barrier insulation film 115 may surround the side surfaces of the first barrier conductive pattern 112. The first barrier conductive pattern 112 may electrically connect the first wiring pattern WL1 and a first memory cell MC1 to be described below.

In some embodiments, the upper surface of the first barrier conductive pattern 112 may be coplanar with the upper surface of the first barrier insulation film 115. Moreover, the lower surface of the first barrier conductive pattern 112 may be coplanar with the lower surface of the first barrier insulation film 115. Accordingly, the first barrier insulation film 115 and the first barrier conductive pattern 112 may be equally thick in a third direction Z that intersects the first direction Y and the second direction X.

In some embodiments, the first barrier conductive pattern 112 may have a line form. For example, the first barrier conductive pattern 112 may extend long in the first direction Y. Therefore, the first barrier conductive pattern 112 may be electrically connected to the first wiring pattern WL1 extending in the first direction Y.

The first barrier conductive pattern 112 may impede/prevent an element (e.g., copper (Cu)) contained in the first wiring pattern WL1 from being diffused into the first memory cell MC1. As an example, the first barrier conductive pattern 112 may include at least one of titanium nitride (TiN), tantalum nitride (TaN), tantalum (Ta), tungsten nitride (WN), tungsten carbonitride (WCN), and tungsten (W). As an example, the first barrier conductive pattern 112 may include titanium nitride.

Figure 3A:
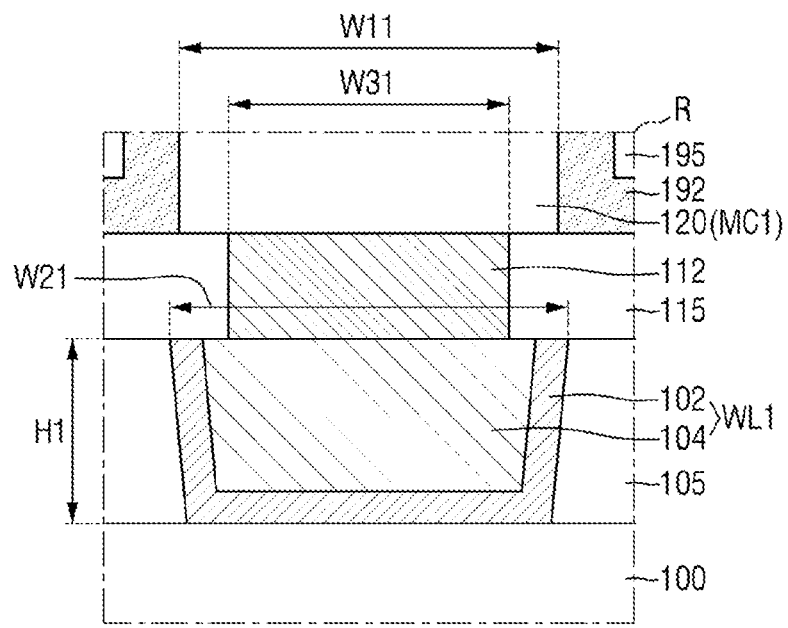
FIGS. 3A to 3D are various enlarged views for explaining a region R of FIG. 2.

In FIG. 3A, although a width W31 of the first barrier conductive pattern 112 is only shown as being smaller than the width W21 of the first wiring pattern WL1, this is just an example. As another example, the width W31 of the first barrier conductive pattern 112 may, of course, be the same as or greater than the width W21 of the first wiring pattern WL1. Here, the width W31 of the first barrier conductive pattern 112 means a width in the second direction X that intersects the direction in which the first barrier conductive pattern 112 extends (that is, the first direction Y). As used herein, the meaning of the term "same" includes not only exactly the same thing, but also minute differences that may occur due to process margins and the like.

Figure 3B:
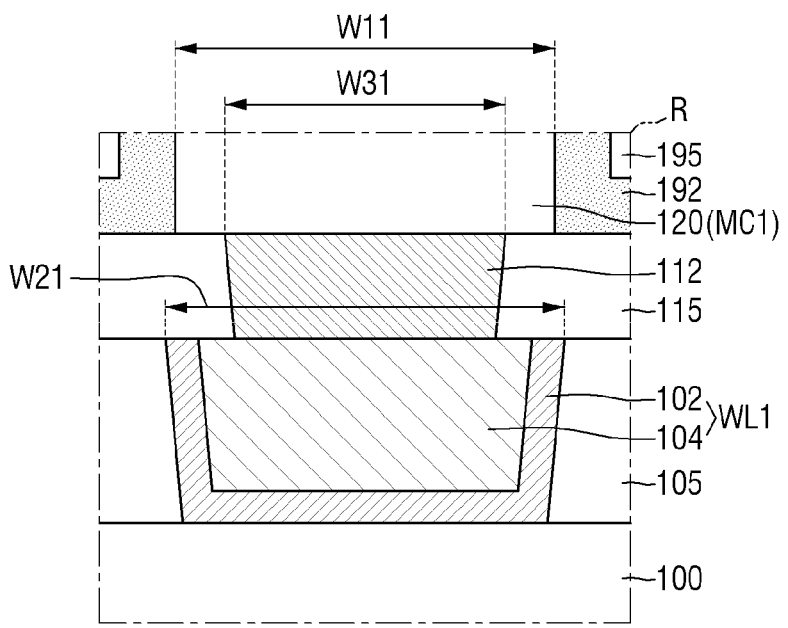
Figure 3C:
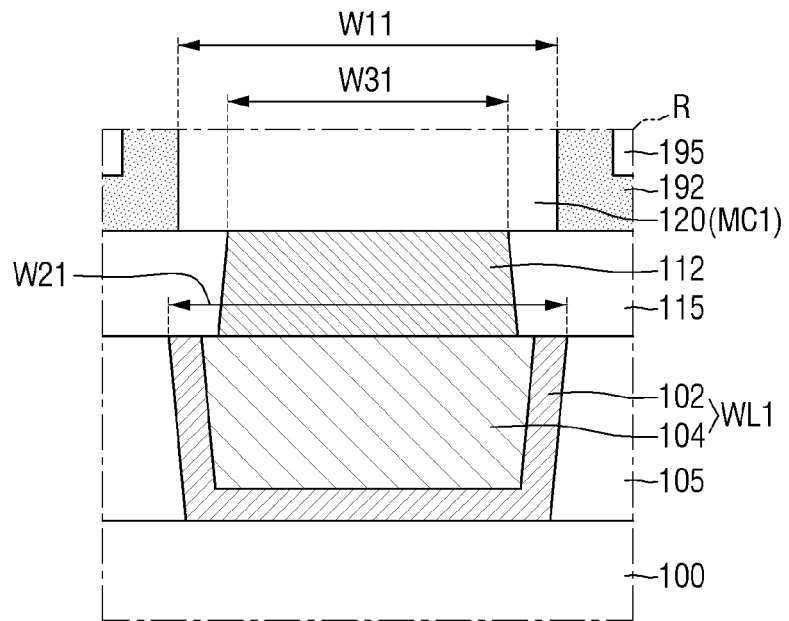

In FIG. 3A, although the width W31 of the first barrier conductive pattern 112 is only shown as being constant, this is just an example. As another example, as shown in FIG. 3B, the width W31 of the first barrier conductive pattern 112 may decrease toward the substrate 100. As still another example, as shown in FIG. 3C, the width W31 of the first barrier conductive pattern 112 may also increase toward the substrate 100.

The first memory cell MC1 may be placed at a cross point between the first wiring pattern WL1 and a second wiring pattern BL to be described below. Further, the first memory cell MC1 may electrically connect the first wiring pattern WL1 and the second wiring pattern BL. A plurality of first memory cells MC1 may be spaced apart from each other to form a plurality of isolated regions. For example, the first memory cells MC1 may be placed to be spaced apart from each other at the cross point on which the plurality of first wiring patterns WL1 and the plurality of second wiring patterns BL are formed. Therefore, the first memory cells MC1 may be arranged in a matrix form to be spaced apart from each other in the first direction Y and the second direction X.

The first memory cell MC1 may be formed on the first barrier insulation film 115 and the first barrier conductive pattern 112. The first memory cell MC1 may be connected to the first barrier conductive pattern 112. For example, a lower surface of the first memory cell MC1 may be in contact with an upper surface of the first barrier conductive pattern 112.

In some embodiments, when the first barrier conductive pattern 112 extends long in the first direction Y, the first barrier conductive pattern 112 may be electrically connected to the plurality of first memory cells MC1 arranged along the first direction Y.

Although the first memory cell MC1 is only shown as having a cylindrical shape, this is just an example. As another example, the first memory cell MC1 may, of course, have various other shapes, such as a quadrangular prism.

The first memory cell MC1 may include a first lower electrode pattern 120, a first selection pattern 130, a first central electrode pattern 140, a first variable resistor pattern 160, and a first upper electrode pattern 180. In some embodiments, the first selection pattern 130 and the first variable resistor pattern 160 may be stacked sequentially on the substrate 100, such that the first selection pattern 130 is between the first variable resistor pattern 160 and the substrate 100. For example, the first selection pattern 130 and the first variable resistor pattern 160 may be placed sequentially along a third direction Z that intersects the upper surface of the substrate 100.

The first lower electrode pattern 120 may be interposed between the first wiring pattern WL1 and the first selection pattern 130. The first lower electrode pattern 120 may electrically connect the first wiring pattern WL1 and the first selection pattern 130. The first lower electrode pattern 120 may include, for example, but is not limited to, at least one of metals such as tungsten (W), platinum (Pt), palladium (Pd), rhodium (Rh), ruthenium (Ru), iridium (Ir), copper (Cu), aluminum (Al), titanium (Ti) and tantalum (Ta), metal nitrides such as titanium nitride (TiN), and combinations thereof. In some embodiments, the first lower electrode pattern 120 may include a carbon (C) layer.

The first selection pattern 130 may be interposed between the first lower electrode pattern 120 and the first central electrode pattern 140. The first selection pattern 130 may control the current flow of the first memory cell MC1. For example, the first selection pattern 130 may be a two-terminal switching element having a threshold voltage. Such a first selection pattern 130 may be based on a threshold switching phenomenon having a non-linear (e.g., S-shaped) current-voltage (I-V) curve. As an example, the first selection pattern 130 may have ovonic threshold switching (OTS) properties.

When the first selection pattern 130 is in an Off state (a high resistance state), if a voltage equal to or higher than a specific voltage (a threshold switching voltage) is applied to the first selection pattern 130, the first selection pattern 130 may be changed to an On state (a low resistance state). In contrast, when the first selection pattern 130 is in the On state (the low resistance state), if the voltage applied to the first selection pattern 130 is lowered to a particular voltage (a maintenance voltage) or less, the first selection pattern 130 may have properties of restoring to the Off state (the high resistance state).

The first selection pattern 130 may include, for example, chalcogenide materials. The chalcogenide materials may include a compound in which at least one of Te and Se as chalcogen elements is combined with at least one of Ge, Sb, Bi, Al, Pb, Sn, Ag, As, S, Si, In, Ti, Ga and P. As an example, the first selection pattern 130 may include at least one of a binary chalcogenide material, a ternary chalcogenide material, a quaternary chalcogenide material, a quinary chalcogenide material, a hexary chalcogenide material, and a combination thereof.

The binary chalcogenide material may include, for example, GeSe, GeS, AsSe, AsTe, AsS SiTe, SiSe, SiS, GeAs, SiAs, SnSe or SnTe.

The ternary chalcogenide material may include, for example, GeAsTe, GeAsSe, AlAsTe, AlAsSe, SiAsSe, SiAsTe, GeSeTe, GeSeSb, GaAsSe, GaAsTe, InAsSe, InAsTe, SnAsSe or SnAsTe.

The quaternary chalcogenide material may include, for example, GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn or GeAsTeZn.

The quinary chalcogenide material may include, for example, GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn or GeAsSeZnSn.

The hexary chalcogenide material may include, for example, GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn or GeAsSeSAlSn.

The first selection pattern 130 may include a single layer or multiple layers of the chalcogenide material. In some embodiments, the first selection pattern 130 may further include impurities in the chalcogenide material. For example, the first selection pattern 130 may include at least one of boron (B), carbon (C), nitrogen (N) and oxygen (O).

The first central electrode pattern 140 may be interposed between the first selection pattern 130 and the first variable resistor pattern 160. The first central electrode pattern 140 may electrically connect the first selection pattern 130 and the first variable resistor pattern 160. The first central electrode pattern 140 may include, but is not limited to, for example, metal nitrides or metal silicon nitrides such as titanium nitride (TiN), titanium silicon nitride (TiSiN), tungsten nitride (WN), tungsten silicon nitride (WSiN), tantalum nitride (TaN), tantalum silicon nitride (TaSiN), zirconium nitride (ZrN), and zirconium silicon nitride (ZrSiN). In some embodiments, the first central electrode pattern 140 may include a carbon (C) layer.

The first variable resistor pattern 160 may be interposed between the first central electrode pattern 140 and the first upper electrode pattern 180. The first variable resistor pattern 160 may electrically connect the first central electrode pattern 140 and the first upper electrode pattern 180.

In some embodiments, the first variable resistor pattern 160 may be a phase change pattern in which the resistance changes in response to a phase change. The phase change pattern may include a phase-change material in which a crystal state is changed by the temperature and/or supply time of heat supplied. Such a phase-change material may have an amorphous state having a relatively high resistance and a crystal state having a relatively low resistance, depending on the temperature. As an example, a phase transition temperature between crystal and amorphous of the phase-change material may be about 250° C. to about 350° C.

For example, the first variable resistor pattern 160 may include compounds in which at least one of Te and Se as chalcogen elements is combined with at least one of Ge, Sb, Bi, Pb, Sn, Ag, As, S, Si, In, Ti, Ga, P, O, and C. As an example, the first variable resistor pattern 160 may include at least one of a binary chalcogenide material, a ternary chalcogenide material, a quaternary chalcogenide material, a quinary chalcogenide material and a combination thereof.

The binary chalcogenide material may include, for example, GeTe, GeSe, GeS, SbSe, SbTe, SbS, SbSe, SnSb, InSe, InSb, AsTe, AlTe, GaSb, AlSb, BiSb, ScSb, Ysb, CeSb, DySb or NdSb.

The ternary chalcogenide material may include, for example, GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe or NdSbS.

The quaternary chalcogenide material may include, for example, GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe or NdGeSbS.

The quinary chalcogenide material may include, for example, InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeZnSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn or GeSbSeZnSn.

When the first variable resistor pattern 160 includes a phase change pattern, the first selection pattern 130 has a phase transition temperature between crystal and amorphous higher than the first variable resistor pattern 160. As an example, the phase transition temperature of the first selection pattern 130 may be about 350° C. to about 450° C.

The first variable resistor pattern 160 may include a single layer or multiple layers of the chalcogenide material. In some embodiments, the first variable resistor pattern 160 may further include impurities in the chalcogenide material. For example, the first variable resistor pattern 160 may include at least one of boron (B), carbon (C), nitrogen (N), oxygen (O), phosphorus (P), cadmium (Cd), tungsten (W), titanium (Ti), hafnium (Hf) and zirconium (Zr).

In some embodiments, a first insertion layer 150 may be interposed between the first central electrode pattern 140 and the first variable resistor pattern 160. The first insertion layer 150 may impede/prevent a material contained in the first central electrode pattern 140 from being diffused into the first variable resistor pattern 160 to deteriorate the properties of the first variable resistor pattern 160. The first insertion layer 150 may include, but is not limited to, for example, a tungsten (W) layer.

The first upper electrode pattern 180 may be interposed between the first variable resistor pattern 160 and the second wiring pattern BL to be described below. The first upper electrode pattern 180 may electrically connect the first variable resistor pattern 160 and the second wiring pattern BL. The first upper electrode pattern 180 may include, but is not limited to, for example, at least one of metals such as tungsten (W), platinum (Pt), palladium (Pd), rhodium (Rh), ruthenium (Ru), iridium (Ir), copper (Cu), aluminum (Al), titanium (Ti) and tantalum (Ta), metal nitrides such as titanium nitride (TiN), and combinations thereof. In some embodiments, the first upper electrode pattern 180 may include a carbon (C) layer.

In some embodiments, a second insertion layer 170 may be interposed between the first variable resistor pattern 160 and the first upper electrode pattern 180. The second insertion layer 170 may impede/prevent a material contained in the first upper electrode pattern 180 from being diffused into the first variable resistor pattern 160 to deteriorate the properties of the first variable resistor pattern 160. The second insertion layer 170 may include, but is not limited to, for example, a tungsten (W) layer.

In some embodiments, the side surfaces of the first lower electrode pattern 120, the side surfaces of the first selection pattern 130, the side surfaces of the first central electrode pattern 140, and the side surfaces of the first insertion layer 150 may be continuous (e.g., aligned with each other in the direction Z). Although the width of the first lower electrode pattern 120, the width of the first selection pattern 130, the width of the first central electrode pattern 140 and the width of the first insertion layer 150 are only shown as having the same width W11, this is just an example. As another example, the first memory cell MC1 including the first lower electrode pattern 120, the first selection pattern 130, the first central electrode pattern 140, and the first insertion layer 150 may also have a tapered shape. As an example, the widths of the first lower electrode pattern 120, the first selection pattern 130, the first central electrode pattern 140, and the first insertion layer 150 may increase toward the substrate 100.

In some embodiments, the side surfaces of the first variable resistor pattern 160, the side surfaces of the second insertion layer 170 and the side surfaces of the first upper electrode pattern 180 may be continuous (e.g., aligned with each other in the direction Z). Although the width of the first variable resistor pattern 160, the width of the second insertion layer 170, and the width of the first upper electrode pattern 180 are only shown as having the same width W12, this is just an example. As another example, the first memory cell MC1 including the first variable resistor pattern 160, the second insertion layer 170, and the first upper electrode pattern 180 may have a tapered shape. As an example, the widths of the first variable resistor pattern 160, the second insertion layer 170, and the first upper electrode pattern 180 may increase toward the substrate 100.

In some embodiments, the width W12 of the first variable resistor pattern 160 may be smaller than the width W11 of the first selection pattern 130. However, this is just an example, and the present disclosure is not limited thereto. As another example, the width W12 of the first variable resistor pattern 160 may be equal to or greater than the width W11 of the first selection pattern 130.

Figure 3D:
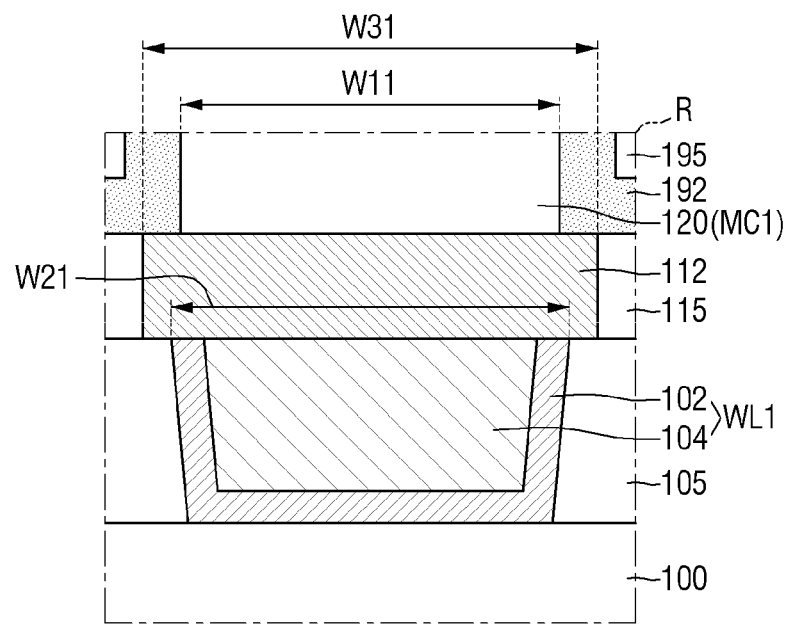

In some embodiments, the side surfaces of the first memory cell MC1 may not be aligned with the side surfaces of the first barrier conductive pattern 112. That is, the side surfaces of the first memory cell MC1 may not be continuous with the side surfaces of the first barrier conductive pattern 112. For example, the width W11 of a portion of the first memory cell MC1 that is adjacent to the first barrier conductive pattern 112 may be different from the width W31 of the first barrier conductive pattern 112. As an example, as shown in FIG. 3A, the width W11 of the first lower electrode pattern 120 may be greater than the width W31 of the first barrier conductive pattern 112. As another example, as shown in FIG. 3D, the width W11 of the first lower electrode pattern 120 may be smaller than the width W31 of the first barrier conductive pattern 112. This may be due to the formation of the first barrier conductive pattern 112 and the first memory cell MC1 at different levels from each other.

In some embodiments, a spacer film 192 extending along the side surfaces of the first variable resistor pattern 160 may be formed. As an example, the spacer film 192 may extend along the side surfaces of the first variable resistor pattern 160, the side surfaces of the second insertion layer 170 and the side surfaces of the first upper electrode pattern 180. In some embodiments, the spacer film 192 may not extend along the side surfaces of the first lower electrode pattern 120, the side surfaces of the first selection pattern 130, the side surfaces of the first central electrode pattern 140, and the side surfaces of the first insertion layer 150.

The spacer film 192 may protect the first variable resistor pattern 160 in the process of forming the first selection pattern 130. As an example, the spacer film 192 may include at least one of silicon nitride (SiN), silicon carbonitride (SiCN) and aluminum nitride (AlN). As an example, the spacer film 192 may include silicon nitride.

In some embodiments, the upper surface of the spacer film 192 may be coplanar with the upper surface of the first upper electrode pattern 180.

The capping film 194 may be formed on the first barrier insulation film 115 and the first memory cell MC1. The capping film 194 may conformally extend along the profile of the upper surface of the first barrier insulation film 115 and the side surface of the first memory cell MC1. The capping film 194 may protect the first memory cell MC1, and thus may be referred to herein as a "protective film." For example, the capping film 194 may protect the first memory cell MC1 from oxidation moisture absorption in the fabricating process of the semiconductor memory device. The capping film 194 may include, but is not limited to, for example, at least one of SiN, $SiO_2$, SiON, SiBN, SiCN, SIOCN, $AL_2O_3$, AlN, AlON and combinations thereof.

In some embodiments, the upper surface of the capping film 194 may be coplanar with the upper surface of the first upper electrode pattern 180. Although the capping film 194 is only shown as a single layer, this is just an example. As another example, the capping film 194 may be multiple films stacked on the first barrier insulation film 115 and the first memory cell MC1.

The gap fill film 195 may be formed on the capping film 194. The gap fill film 195 may be on (e.g., may cover) the capping film 194. The gap fill film 195 may fill the space between the first memory cells MC1, and thus may be referred to herein as an "interlayer insulation film." Accordingly, the gap fill film 195 may impede/prevent an interference between the first memory cells MC1. For example, the gap fill film 195 may impede/prevent heat from being diffused between adjacent first memory cells MC1 to reduce/prevent cross-talk between the first variable resistor patterns 160. The gap fill film 195 may include, but is not limited to, for example, at least one of SiN, SiON, SiC, SiCN, SiOC, SiOCN, $SiO_2$, $Al_2O_3$ and combinations thereof.

In some embodiments, the upper surface of the gap fill film 195 may be coplanar with the upper surface of the first upper electrode pattern 180. Although the gap fill film 195 is only shown as a single layer, this is just an example. As another example, the gap fill film 195 may be multiple films stacked on the capping film 194.

The second inter-wiring insulation film 205 may be formed on the first memory cell MC1. For example, the second inter-wiring insulation film 205 may be on (e.g., may cover) the upper surface of the first upper electrode pattern 180, the upper surface of the spacer film 192, the upper surface of the capping film 194, and the upper surface of the gap fill film 195. The second inter-wiring insulation film 205 may include, but is not limited to, for example, at least one of silicon oxide, silicon nitride, silicon oxynitride, and a combination thereof. As an example, the second inter-wiring insulation film 205 may include silicon oxide.

The second wiring pattern BL may be formed in the second inter-wiring insulation film 205. The plurality of second wiring patterns BL may be spaced apart from each other and extend side by side. Further, each second wiring pattern BL may intersect each first wiring pattern WL. For example, the plurality of second wiring patterns BL may each extend in the second direction X, which is parallel to the upper surface of the substrate 100 and intersects the first direction Y. The second inter-wiring insulation film 205 may electrically separate the plurality of second wire patterns BL. The second wiring pattern BL may function as a bit line of the semiconductor memory device according to some embodiments.

The second wiring pattern BL may include, but is not limited to, for example, at least one of tungsten (W), tungsten nitride (WN), gold (Au), silver (Ag), copper (Cu), aluminum (Al), titanium aluminum nitride (TiAlN), nickel (Ni), cobalt (Co), chromium (Cr), tin (Sn), zinc (Zn), indium tin oxide (ITO), and combinations thereof. The second wiring pattern BL may include the same material as or a different material from the first wiring pattern WL1. Preferably, the second wiring pattern BL may include copper (Cu).

In some embodiments, the second wiring pattern BL may include a second barrier conductive film 202 and a second filling conductive film 204. The second barrier conductive film 202 may be interposed between the second inter-wiring insulation film 205 and the second filling conductive film 204. For example, a trench extending in the second direction X may be formed in the second inter-wiring insulation film 205. The second barrier conductive film 202 may conformally extend along the profile of the trench. The second filling conductive film 204 may fill the region of trench that remains after the second barrier conductive film 202 is formed.

The second barrier conductive film 202 may impede/prevent an element (for example, copper (Cu)) contained in the second filling conductive film 204 from being diffused into the second inter-wiring insulation film 205. As an example, the second filling conductive film 204 may include copper (Cu), and the second barrier conductive film 202 may include at least one of titanium (Ti), titanium nitride (TiN), tantalum (Ta) and tantalum nitride (TaN). As an example, the second barrier conductive film 202 may include titanium nitride (TiN).

In some embodiments, the second wiring pattern BL may be formed by a damascene process. In some embodiments, the width of the second wiring pattern BL may decrease toward the substrate 100. Here, the width of the second wiring pattern BL means a width in the first direction Y that intersects the direction in which the second wiring pattern BL extends (that is, the second direction X). This may be due to the properties of the etching process of forming the trench in the second inter-wiring insulation film 205 to form the second wire pattern BL.

With the rapid progress of down-scaling due to development of electronic technology, demand may increase for high integration and low power consumption of semiconductor memory devices. In order to cope with such demand, it may be beneficial to provide wiring having a relatively low resistance (for example, a copper (Cu) wiring). However, the diffusion of elements included in wiring can cause deterioration of the properties of the semiconductor memory device. For example, in a semiconductor memory device including a copper wiring and a memory cell connected to the copper wiring, diffusion of a copper (Cu) element can cause deterioration of the properties of the memory cell.

However, the semiconductor memory device according to some embodiments may provide improved performance, by including the first barrier insulation film 115 and the first barrier conductive pattern 112. Specifically, as described above, the first barrier insulation film 115 and the first barrier conductive pattern 112 may be interposed between the first wiring pattern WL1 and the first memory cell MC1 to impede/prevent an element (e.g., copper (Cu)) contained in the first wiring pattern WL1 from being diffused into the first memory cell MC1. As a result, since deterioration of the properties of the first memory cell MC1 is impeded/prevented, while having the first wiring pattern WL1 having a low wiring resistance, a semiconductor memory device having improved performance can be provided.

Figure 4:
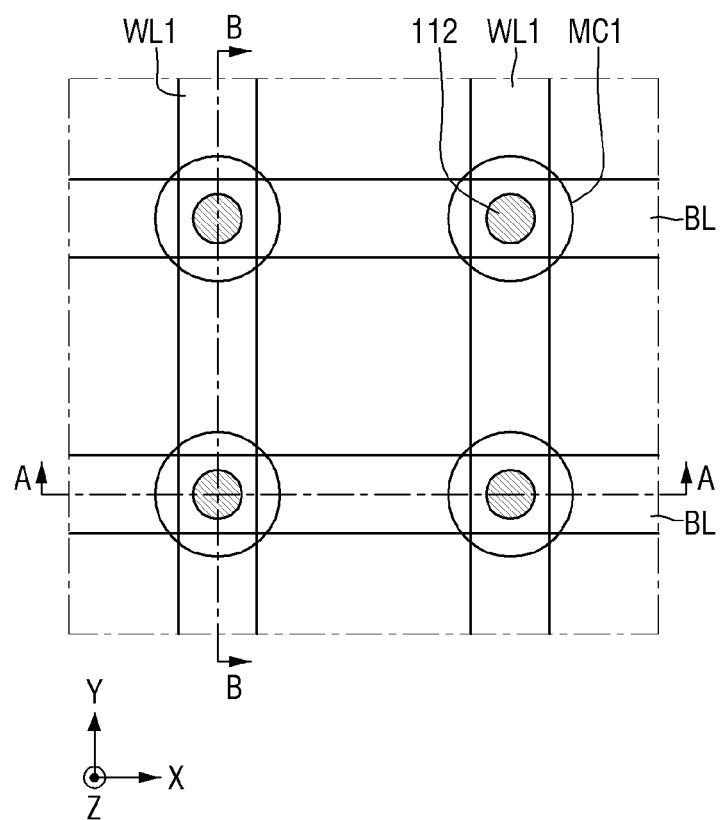
FIG. 4 is a schematic layout diagram for explaining a semiconductor memory device according to some embodiments.
Figure 5:
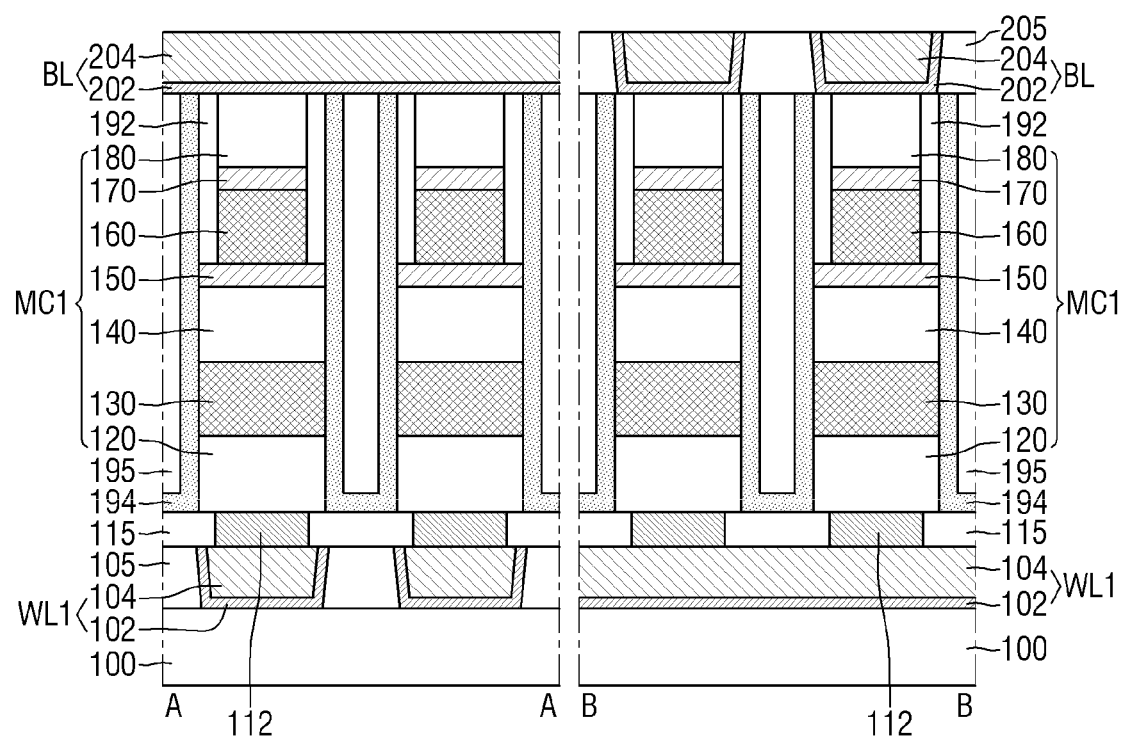
FIG. 5 is a schematic cross-sectional view taken along lines A-A and B-B of FIG. 4.

FIG. 4 is a schematic layout diagram for explaining a semiconductor memory device according to some embodiments. FIG. 5 is a schematic cross-sectional view taken along lines A-A and B-B of FIG. 4. For convenience of explanation, repeated parts of contents explained above using FIGS. 1 to 3D will be briefly explained or omitted.

Referring to FIGS. 4 and 5, in the semiconductor memory device according to some embodiments, the first barrier conductive pattern 112 has a pillar shape.

For example, holes extending in the third direction Z may be formed in (e.g., completely through upper and lower surfaces of) the first barrier insulation film 115. The first barrier conductive pattern 112 may be formed to fill the holes.

Although the first barrier conductive pattern 112 is only shown as having a cylindrical shape, this is only an example.

As another example, the first barrier conductive pattern 112 may, of course, have various other shapes, such as a quadrangular prism.

The pillar-shaped first barrier conductive pattern 112 may be placed at the cross point between the first wiring pattern WL1 and the second wiring pattern BL. The plurality of first barrier conductive patterns 112 may be spaced apart from each other to form a plurality of isolated regions. For example, the first barrier conductive patterns 112 may be placed to be spaced apart from each other at a cross point on which a plurality of first wiring patterns WL1 and a plurality of second wiring patterns BL are formed. Therefore, the first barrier conductive patterns 112 may be spaced apart from each other in the first direction Y and the second direction X, and arranged in a matrix from.

Figure 6:
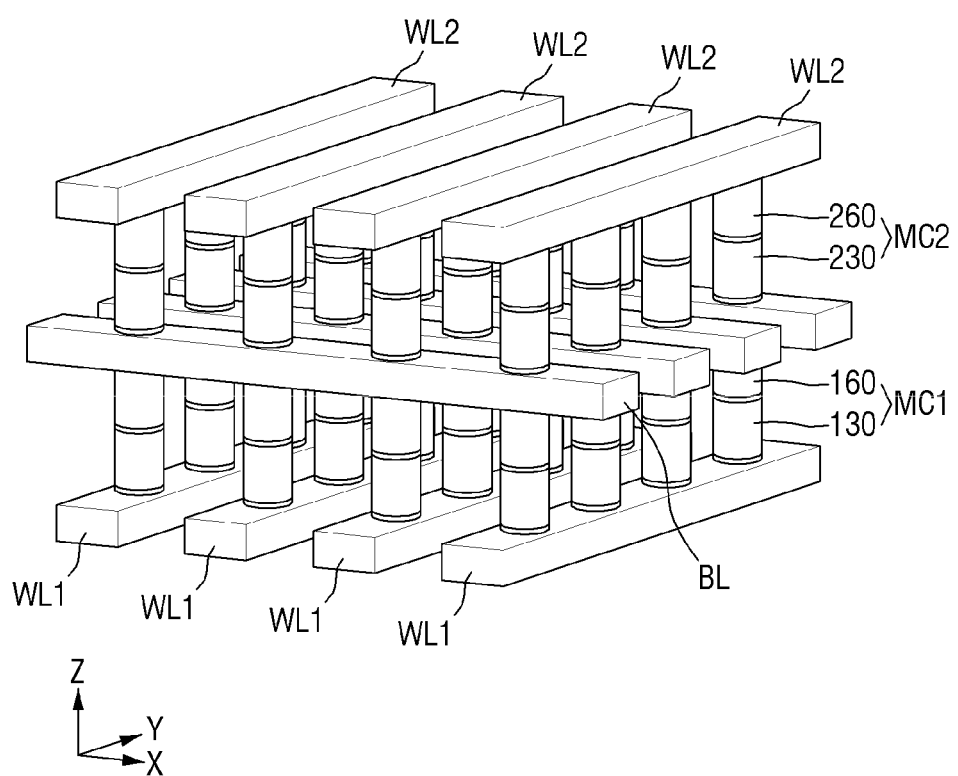
FIG. 6 is a schematic perspective view for explaining a semiconductor memory device according to some embodiments.
Figure 7:
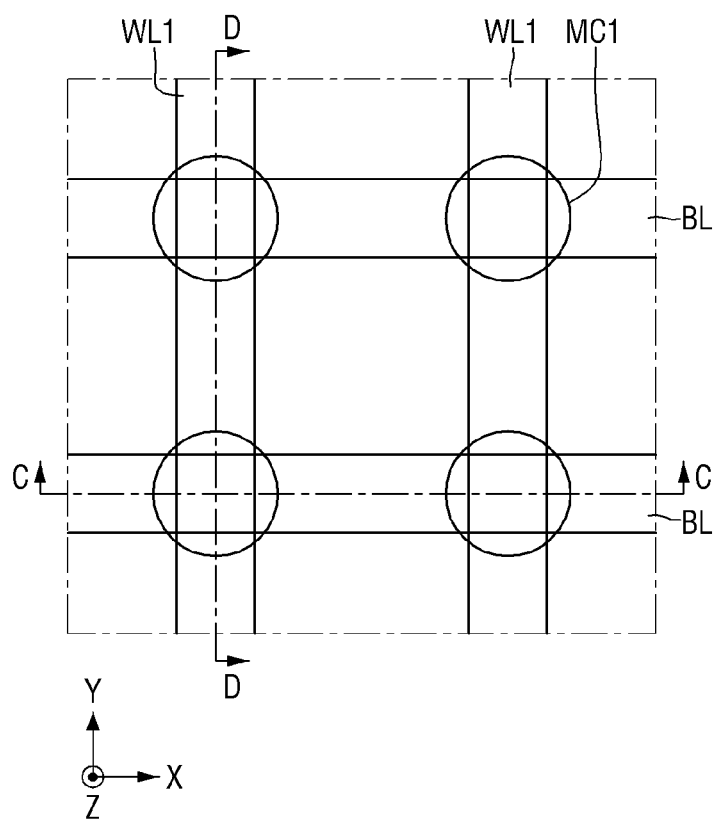
FIG. 7 is a schematic layout diagram for explaining the semiconductor memory device of FIG. 6.
Figure 8:
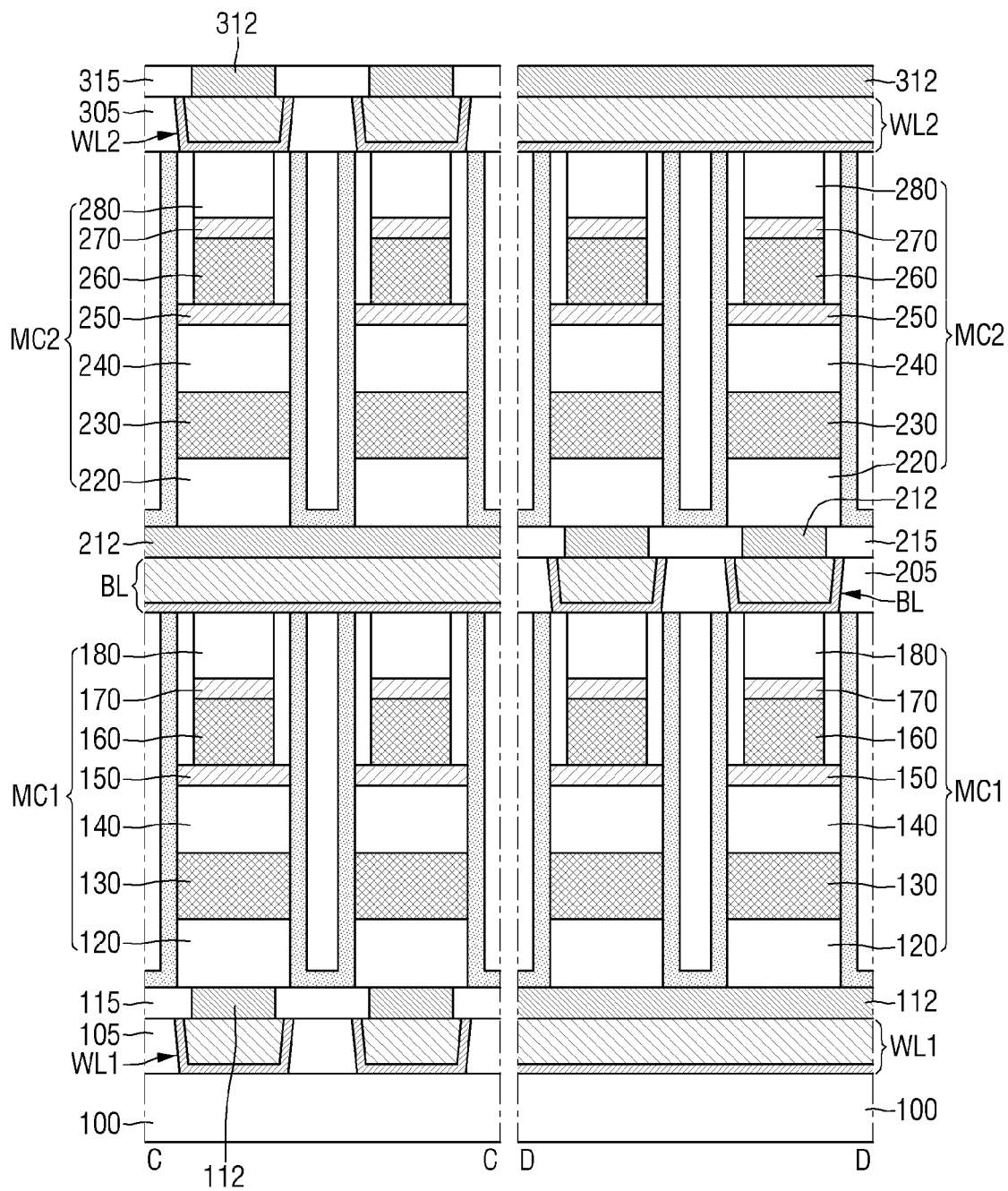
FIGS. 8 and 9 are various schematic cross-sectional views taken along lines C-C and D-D of FIG. 7.
Figure 9:
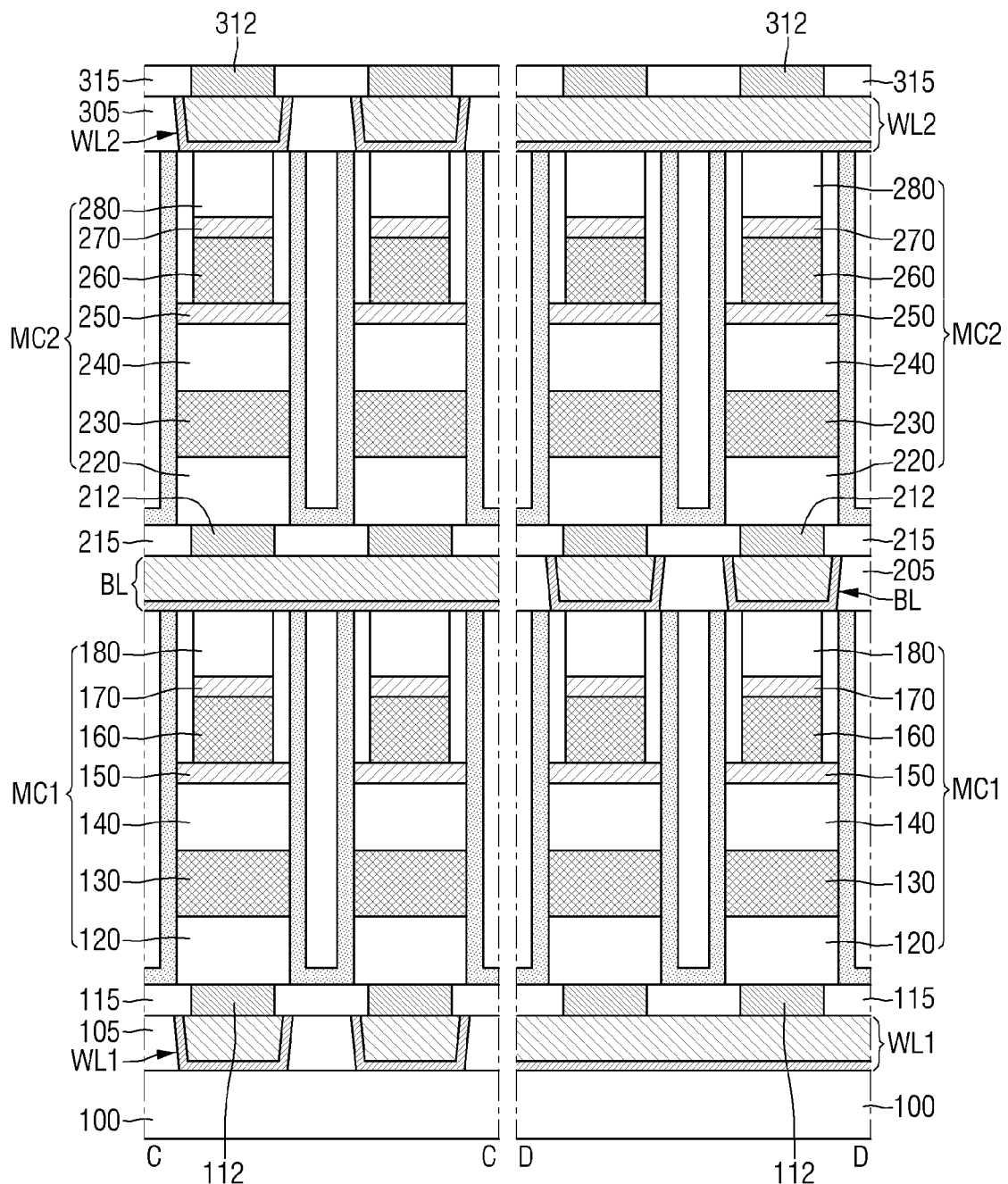

FIG. 6 is a schematic perspective view for explaining the semiconductor memory device according to some embodiments. FIG. 7 is a schematic layout diagram for explaining the semiconductor memory device of FIG. 6. FIGS. 8 and 9 are various schematic cross-sectional views taken along lines C-C and D-D of FIG. 7. For convenience of explanation, repeated parts of contents explained above using FIGS. 1 to 5 will be briefly explained or omitted.

Referring to FIG. 6, the semiconductor memory device according to some embodiments includes a cross point memory cell array.

For example, the semiconductor memory device according to some embodiments may include first wiring patterns WL1, second wiring patterns BL, third wiring patterns WL2, first memory cells MC1, and second memory cells MC2.

The first wiring patterns WL1 and the third wiring patterns WL2 may be arranged along the third direction Z. The first wiring patterns WL1 and the third wiring patterns WL2 may each extend in the first direction Y. The second wiring patterns BL may be interposed between the first wiring patterns WL1 and the third wiring patterns WL2. The second wiring patterns BL may each extend in the second direction X which intersects the first direction Y. The first memory cells MC1 may be placed at the cross point between the first wiring patterns WL1 and the second wiring patterns BL. The second memory cells MC2 may be placed at the cross point between the second wiring patterns BL and the third wiring patterns WL2.

The first memory cells MC1 may each include a first selection pattern 130 and a first variable resistor pattern 160. The second memory cells MC2 may each include a second selection pattern 230 and a second variable resistor pattern 260. Although FIG. 6 only shows that the second selection pattern 230 and the second variable resistor pattern 260 are sequentially stacked on the second wiring pattern BL, such that the second selection pattern 230 is between the second variable resistor pattern 260 and the second wiring pattern BL, this is just an example. As another example, the second variable resistor pattern 260 and the second selection pattern 230 may be sequentially stacked on the second wiring pattern BL, such that the second variable resistor pattern 260 is between the second selection pattern 230 and the second wiring pattern BL.

Also, although FIG. 6 shows that only two memory cells MC1 and MC2 are placed along the third direction Z, this is only for convenience of explanation. Unlike that shown, the first wiring patterns WL1 and the second wiring patterns BL may be further arranged repeatedly on the third wiring patterns WL2. Accordingly, three or more memory cells may be placed along the third direction Z.

Referring to FIGS. 6 to 9, the semiconductor memory device according to some embodiments further includes a second barrier insulation film 215, a second barrier conductive pattern 212, a second memory cell MC2, a third inter-wiring insulation film 305, a third wiring pattern WL2, a third barrier insulation film 315, and a third barrier conductive pattern 312.

The second barrier insulation film 215 may be formed on the second inter-wiring insulation film 205 and the second wiring pattern BL. The second barrier insulation film 215 may be on (e.g., may cover) the upper surface of the second inter-wiring insulation film 205. In some embodiments, the second barrier insulation film 215 may be on (e.g., may cover) a part of the upper surface of the second wiring pattern BL.

The second barrier insulation film 215 may protect the second wiring pattern BL by impeding/preventing the second wiring pattern BL from being oxidized. Further, the second barrier insulation film 215 may impede/prevent an element (e.g., copper (Cu)) contained in the second wiring pattern BL from being diffused into the second memory cell MC2. As an example, the second barrier insulation film 215 may include at least one of silicon nitride (SiN), silicon carbonitride (SiCN) and aluminum nitride (AlN). As an example, the second barrier insulation film 215 may include silicon nitride. The second barrier insulation film 215 may include the same material as or a different material from the first barrier insulation film 115.

The second barrier conductive pattern 212 may be formed in the second barrier insulation film 215. The second barrier conductive pattern 212 may be connected to the second wiring pattern BL. For example, the second barrier conductive pattern 212 may penetrate the second barrier insulation film 215 and come into contact with the upper surface of the second wiring pattern BL. That is, the second barrier insulation film 215 may surround the side surfaces of the second barrier conductive pattern 212. The second barrier conductive pattern 212 may electrically connect the second wiring pattern BL and the second memory cell MC2 to be described later.

In some embodiments, the upper surface of the second barrier conductive pattern 212 may be coplanar with the upper surface of the second barrier insulation film 215.

In some embodiments, the second barrier conductive pattern 212 may have a line form. For example, the second barrier conductive pattern 212 may extend long in the second direction X. Therefore, the second barrier conductive pattern 212 may be electrically connected to the second wiring pattern BL extending in the second direction X.

The second barrier conductive pattern 212 may impede/prevent an element (e.g., copper (Cu)) contained in the second wiring pattern BL from being diffused into the second memory cell MC2. As an example, the second barrier conductive pattern 212 may include at least one of titanium nitride (TiN), tantalum nitride (TaN), tantalum (Ta), tungsten nitride (WN), tungsten carbonitride (WCN), and tungsten (W). As an example, the second barrier conductive pattern 212 may include titanium nitride. The second barrier conductive pattern 212 may include the same material as or a different material from the first barrier conductive pattern 112.

The second memory cell MC2 may be placed at the cross point between the second wiring pattern BL and the third wiring pattern WL2. Further, the second memory cell MC2 may electrically connect the second wiring pattern BL and the third wiring pattern WL2. The plurality of second memory cells MC2 may be spaced apart from each other to form a plurality of isolated regions. For example, the second memory cells MC2 may be placed to be spaced apart from each other at cross points on which the plurality of second wiring patterns BL and the plurality of third wiring patterns WL2 are formed. Therefore, the second memory cells MC2 may be spaced apart from each other in the first direction Y and the second direction X and arranged in a matrix form.

The second memory cell MC2 may be formed on the second barrier insulation film 215 and the second barrier conductive pattern 212. The second memory cell MC2 may be connected to the second barrier conductive pattern 212. For example, the lower surface of the second memory cell MC2 may be in contact with the upper surface of the second barrier conductive pattern 212.

In some embodiments, when the second barrier conductive pattern 212 extends long in the second direction X, the second barrier conductive pattern 212 may be electrically connected to a plurality of second memory cells MC2 arranged along the second direction X.

Although the second memory cell MC2 is only shown as having a cylindrical shape, this is just an example. As another example, the second memory cell MC2 may, of course, have various other shapes, such as a quadrangular prism.

The second memory cell MC2 may include a second lower electrode pattern 220, a second selection pattern 230, a second central electrode pattern 240, a third insertion layer 250, a second variable resistor pattern 260, a fourth insertion layer 270, and a second upper electrode pattern 280. The second lower electrode pattern 220, the second selection pattern 230, the second central electrode pattern 240, the third insertion layer 250, the second variable resistor pattern 260, the fourth insertion layer 270, and the second upper electrode pattern 280 may correspond to the first lower electrode pattern 120, the first selection pattern 130, the first central electrode pattern 140, the first insertion layer 150, the first variable resistor pattern 160, the second insertion layer 170, and the first upper electrode pattern 180, respectively, described above, detailed explanation thereof will not be provided below.

The third inter-wiring insulation film 305 may be formed on the second memory cell MC2. Since the third inter-wiring insulation film 305 is similar to the first inter-wiring insulation film 105, a detailed explanation thereof will not be provided below.

The third wiring pattern WL2 may be formed in the third inter-wiring insulation film 305. The plurality of third wiring patterns WL2 may be spaced apart from each other and extend side by side. For example, the plurality of third wiring patterns WL2 may each extend in the first direction Y. The third inter-wiring insulation film 305 may electrically separate the plurality of third wiring patterns WL2. The third wiring pattern WL2 may function as a second word line of the semiconductor memory device according to some embodiments.

The third wiring pattern WL2 may include, but is not limited to, at least one of tungsten (W), tungsten nitride (WN), gold (Au), silver (Ag), copper (Cu), aluminum (Al), titanium aluminum nitride (TiAlN), nickel (Ni), cobalt (Co), chromium (Cr), tin (Sn), zinc (Zn), indium tin oxide (ITO), and combinations thereof. The third wiring pattern WL2 may include the same material as or a different material from the first wiring pattern WL1. Preferably, the third wiring pattern WL2 may include copper (Cu).

The third barrier insulation film 315 may be formed on the third inter-wiring insulation film 305 and the third wiring pattern WL2. Since the third barrier insulation film 315 may be similar to the first barrier insulation film 115, detailed explanation thereof will not be provided below. The third barrier conductive pattern 312 may be formed in the third barrier insulation film 315. Since the third barrier conductive pattern 312 may be similar to the first barrier conductive pattern 112, detailed explanation thereof will not be provided below.

The first memory cell MC1 and the second memory cell MC2 may be further repeatedly formed on the third inter-wiring insulation film 305 and the third wiring pattern WL2. As a result, three or more memory cells may be placed along the third direction Z.

Hereinafter, a method for fabricating a semiconductor memory device according to an example embodiment will be described referring to FIGS. 1 to 22.

FIGS. 10 to 16 are intermediate stage diagrams for explaining a method for fabricating the semiconductor memory device according to some embodiments. For convenience of explanation, repeated parts of contents explained above using FIGS. 1 to 5 will be briefly explained or omitted.

Figure 10:
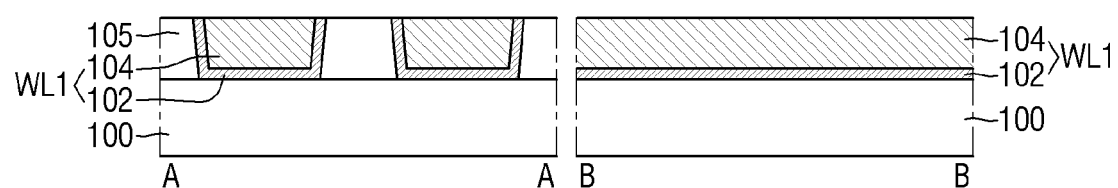
FIGS. 10 to 16 are intermediate stage diagrams for explaining a method for fabricating a semiconductor memory device according to some embodiments.

Referring to FIG. 10, the first inter-wiring insulation film 105 and the first wiring pattern WL1 are formed on the substrate 100.

For example, the first inter-wiring insulation film 105 may be formed on the substrate 100. Subsequently, trenches spaced apart from each other and extending in the first direction Y may be formed in the first inter-wiring insulation film 105. The first wiring pattern WL1 may be formed to fill the trenches. As a result, the first wiring patterns WL1 spaced apart from each other and each extending in the first direction Y may be formed in the first inter-wiring insulation film 105.

The first wiring pattern WL1 may include, but is not limited to, at least one of tungsten (W), tungsten nitride (WN), gold (Au), silver (Ag), copper (Cu), aluminum (Al), titanium aluminum nitride (TiAlN), nickel (Ni), cobalt (Co), chromium (Cr), tin (Sn), zinc (Zn), indium tin oxide (ITO), and combinations thereof. Preferably, the first wiring pattern WL1 may include copper (Cu). The first wiring pattern WL1 may be formed by, but is not limited to, for example, a damascene process.

In some embodiments, the first wiring pattern WL1 may include a first barrier conductive film 102 and a first filling conductive film 104.

Figure 11:
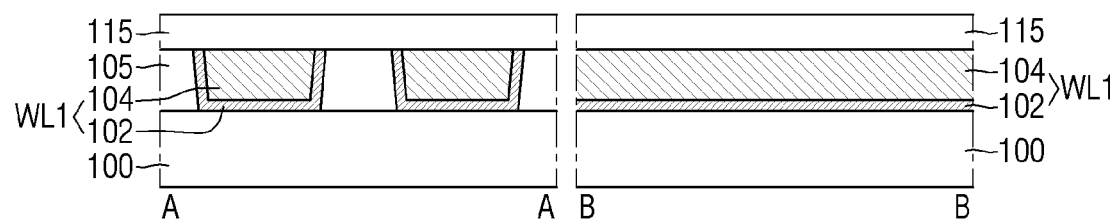

Referring to FIG. 11, the first barrier insulation film 115 is formed on the first inter-wiring insulation film 105 and the first wiring pattern WL1.

The first barrier insulation film 115 may be on (e.g., may cover) the upper surface of the first inter-wiring insulation film 105 and the upper surface of the first wiring pattern WL1. The first barrier insulation film 115 may include at least one of silicon nitride (SiN), silicon carbonitride (SiCN) and aluminum nitride (AlN). As an example, the first barrier insulation film 115 may include silicon nitride. The first barrier insulation film 115 may be formed by, but is not limited to, for example, at least one of a chemical vapor deposition (CVD) process, a physical vapor deposition (PVD) process, an atomic layer deposition (ALD) process, and combinations thereof.

Figure 12:
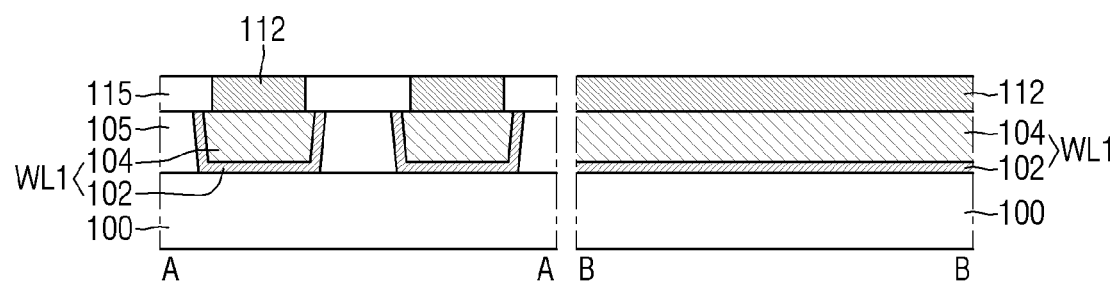

Referring to FIG. 12, the first barrier conductive pattern 112 is formed in the first barrier insulation film 115.

For example, trenches that expose the first wiring pattern WL1 may be formed in the first barrier insulation film 115. The first barrier conductive pattern 112 may be formed to fill the trenches. As a result, the first barrier conductive pattern 112 connected (e.g., electrically connected) to the first wiring pattern WL1 may be formed in the first barrier insulation film 115.

In some embodiments, each of the trenches may extend long in the first direction Y. As a result, the first barrier conductive pattern 112 described above using FIGS. 1 and 2 may be formed.

In some embodiments, holes extending in the third direction Z may be formed in the first barrier insulation film 115. The first barrier conductive pattern 112 may be formed to fill the holes. As a result, the first barrier conductive pattern 112 described above using FIGS. 4 and 5 may be formed.

Figure 13:
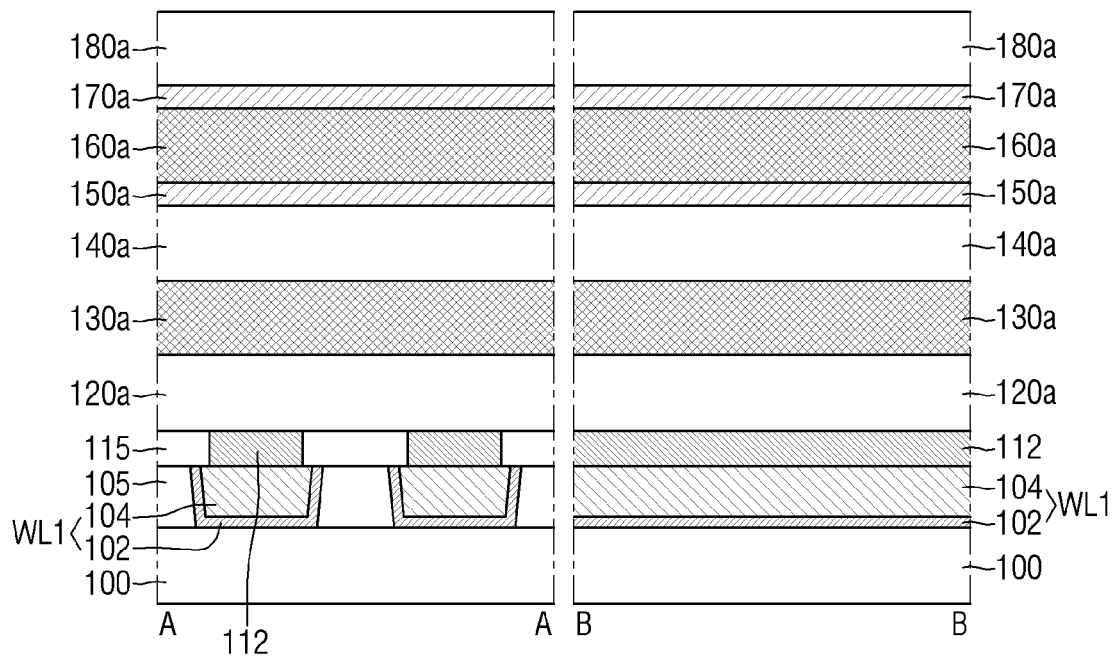

Referring to FIG. 13, a lower electrode film 120a, a selection film 130a, a central electrode film 140a, a first preliminary insertion layer 150a, a variable resistor film 160a, a second preliminary insertion layer 170a and an upper electrode film 180a are formed sequentially on the first barrier insulation film 115 and the first barrier conductive pattern 112.

The lower electrode film 120a and the upper electrode film 180a may each include, but are not limited to, for example, at least one of metals such as tungsten (W), platinum (Pt), palladium (Pd), rhodium (Rh), ruthenium (Ru), iridium (Ir), copper (Cu), aluminum (Al), titanium (Ti), and tantalum (Ta), metal nitrides such as titanium nitride (TiN), and combinations thereof. In some embodiments, the lower electrode film 120a and the upper electrode film 180a may each include a carbon (C) layer.

The selection film 130a may have ovonic threshold switching (OTS) properties. For example, the selection film 130a may include compounds in which at least one of Te and Se as the chalcogen elements is combined with at least one of Ge, Sb, Bi, Al, Pb, Sn, Ag, As, S, Si, In, Ti, Ga and P.

The central electrode film 140a may include, but is not limited to, for example, metal nitride or metal silicon nitride such as titanium nitride (TiN), titanium silicon nitride (TiSiN), tungsten nitride (WN), tungsten silicon nitride (WSiN), tantalum nitride (TaN), tantalum silicon nitride (TaSiN), zirconium nitride (ZrN), and zirconium silicon nitride (ZrSiN). In some embodiments, the central electrode film 140a may include a carbon (C) layer.

The first preliminary insertion layer 150a may include, but is not limited to, for example, tungsten (W).

The variable resistor film 160a may include a phase-change material whose crystal state is changed depending on the temperature and/or supply time of heat supplied. For example, the first variable resistor pattern 160 may include compounds in which at least one of Te and Se as the chalcogen elements is combined with least one of Ge, Sb, Bi, Pb, Sn, Ag, As, S, Si, In, Ti, Ga, P, O, and C.

The second preliminary insertion layer 170a may include, but is not limited to, for example, tungsten (W).

Figure 14:
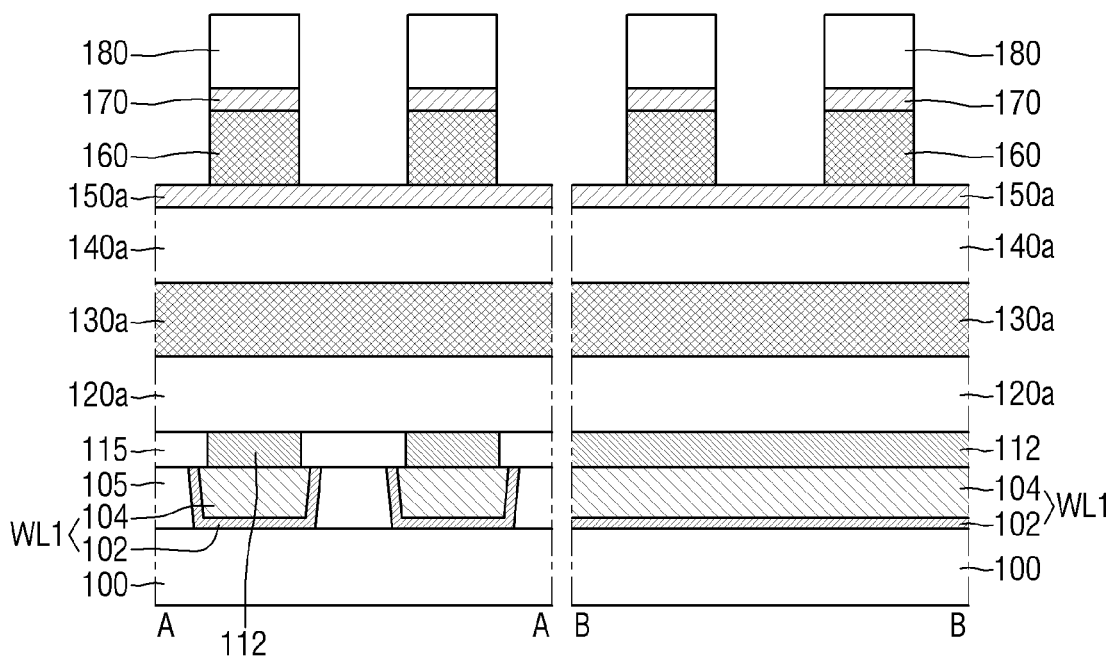

Referring to FIG. 14, the first variable resistor pattern 160, the second insertion layer 170 and the first upper electrode pattern 180 are formed.

For example, the variable resistor film 160a, the second preliminary insertion layer 170a and the upper electrode film 180a of FIG. 13 may be patterned. In some embodiments, a plurality of stacks including the first variable resistor pattern 160, the second insertion layer 170, and the first upper electrode pattern 180 may be spaced apart from each other in the first direction Y and the second direction X, and arranged in a matrix form.

Figure 15:
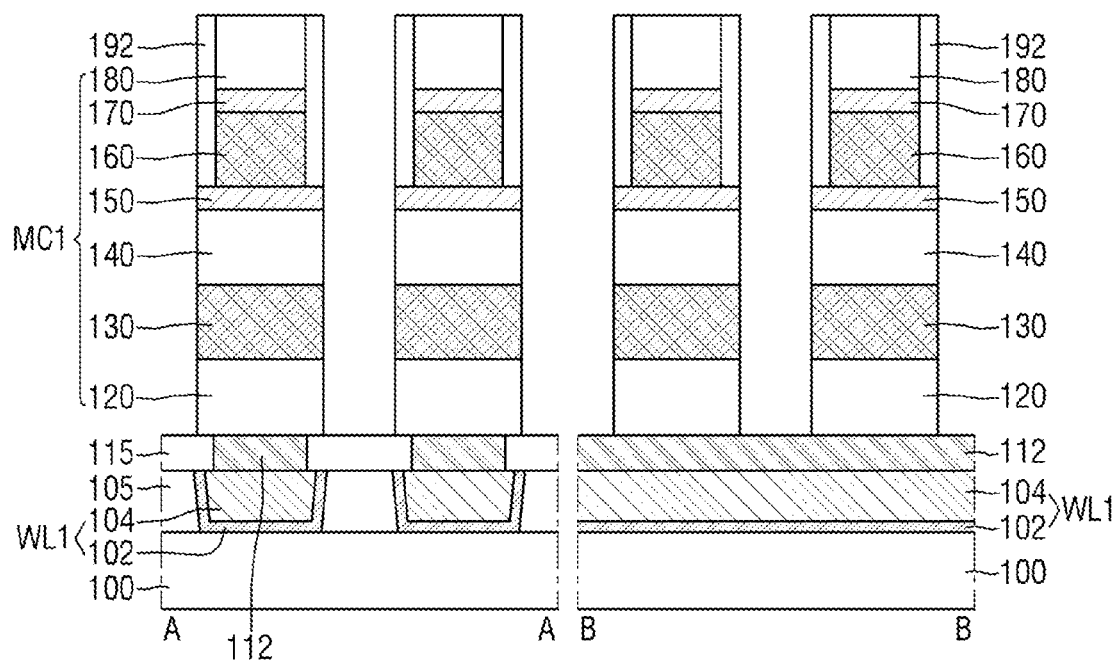

Referring to FIG. 15, the first lower electrode pattern 120, the first selection pattern 130, the first central electrode pattern 140 and the first insertion layer 150 are formed.

For example, a spacer film 192 extending along the side surfaces of the first variable resistor pattern 160, the side surfaces of the second insertion layer 170 and the side surfaces of the first upper electrode pattern 180 may be formed. Subsequently, the lower electrode film 120a, the selection film 130a, the central electrode film 140a, and the first preliminary insertion layer 150a of FIG. 14 may be patterned, using the spacer film 192 as an etching mask. In some embodiments, a plurality of stacks including the first lower electrode pattern 120, the first selection pattern 130, the first central electrode pattern 140, and the first insertion layer 150 may be spaced apart from each other in the first direction Y and the second direction X, and arranged in a matrix form.

Accordingly, the first memory cell MC1 including the first lower electrode pattern 120, the first selection pattern 130, the first central electrode pattern 140, the first insertion layer 150, the first variable resistor pattern 160, the second insertion layer 170 and the first upper electrode pattern 180 may be formed.

In some embodiments, the width (e.g., the width W11 of FIG. 2) of the stack including the first lower electrode pattern 120, the first selection pattern 130, the first central electrode pattern 140, and the first insertion layer 150 may be greater than the width (e.g., the width W12 of FIG. 2) of the stack including the first variable resistor pattern 160, the second insertion layer 170, and the first upper electrode pattern 180.

Figure 16:
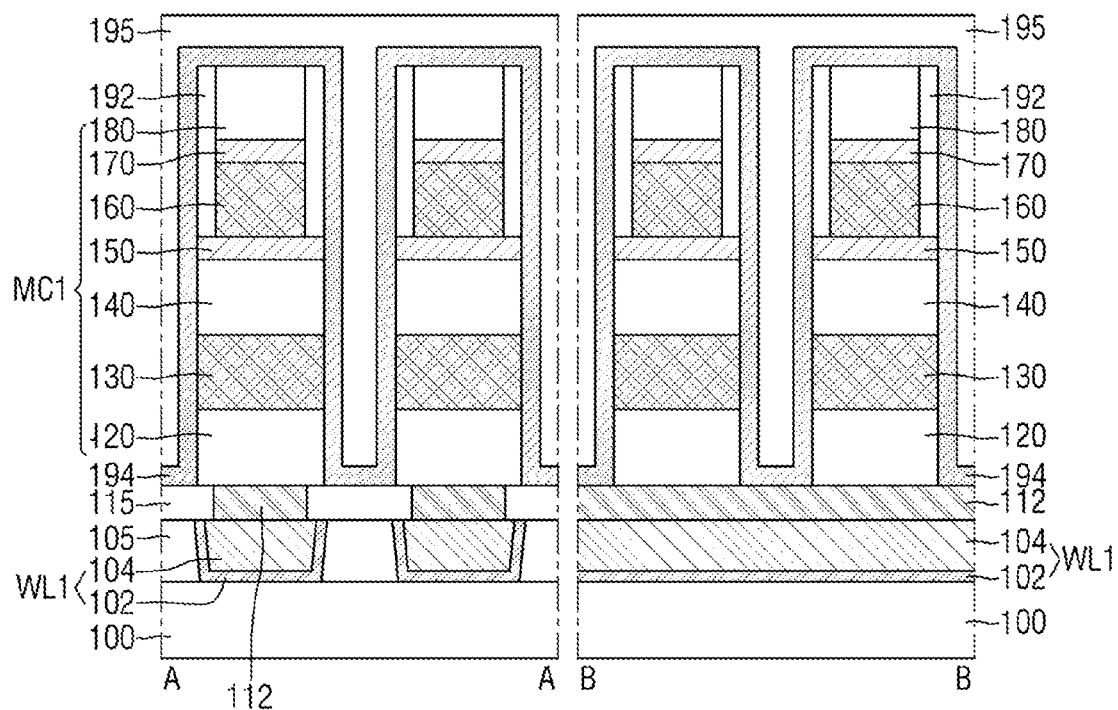

Referring to FIG. 16, a capping film 194 and a gap fill film 195 are sequentially formed on the first memory cell MC1.

The capping film 194 may conformally extend along the profiles of the upper surface of the first barrier insulation film 115 and the side surface of the first memory cell MC1. The capping film 194 may include, but is not limited to, for example, at least one of SiN, $SiO_2$, SiON, SiBN, SiCN, SIOCN, $AL_2O_3$, AlN, AlON and combinations thereof. The capping film 194 may be formed by, but is not limited to, for example, at least one of a chemical vapor deposition (CVD) process, a physical vapor deposition (PVD) process, an atomic layer deposition (ALD) process, and combinations thereof.

In some embodiments, the capping film 194 may be subjected to post-treatment with an inert gas (e.g., nitrogen ($N_2$) gas, helium (He) gas or argon (Ar) gas). The post-treatment process may include, but is not limited to, for example, a heat treatment, an ultraviolet (UV) treatment or a plasma treatment. The properties of the capping film 194 (e.g., a dry etching rate or a wet etching rate) may be improved through such a post-treatment process.

The gap fill film 195 may be formed on the capping film 194. The gap fill film 195 may be on (e.g., may cover) the capping film 194. The gap fill film 195 may fill the space between the first memory cells MC1. The gap fill film 195 may include, but is not limited to, for example, at least one of SiN, SiON, SiC, SiCN, SiOC, SiOCN, $SiO_2$, $Al_2O_3$ and combinations thereof. The gap fill film 195 may be formed by, but is not limited to, for example, at least one of a chemical vapor deposition (CVD) process, a physical vapor deposition (PVD) process, an atomic layer deposition (ALD) process, a Spin on Glass (SOG) process, and a combination thereof.

Subsequently, referring to FIG. 2, the second inter-wiring insulation film 205 and the second wiring pattern BL are formed on the first memory cell MC1.

For example, a flattening process of exposing the first upper electrode pattern 180 may be performed. The flattening process may include, but is not limited to, for example, a chemical mechanical polishing (CMP) process. Subsequently, the second inter-wiring insulation film 205 may be formed on the first upper electrode pattern 180, the spacer film 192, the capping film 194, and the gap fill film 195.

Subsequently, trenches spaced part from each other and extending in the second direction X may be formed in the second inter-wiring insulation film 205. The second wiring pattern BL may be formed to fill the trenches. As a result, the second wiring patterns BL spaced apart from each other and extending in the second direction X may be formed in the second inter-wiring insulation film 205.

The second wiring pattern BL may include, but is not limited to, at least one of tungsten (W), tungsten nitride (WN), gold (Au), silver (Ag), copper (Cu), aluminum (Al), titanium aluminum nitride (TiAlN), nickel (Ni), cobalt (Co), chromium (Cr), tin (Sn), zinc (Zn), indium tin oxide (ITO), and combinations thereof. Preferably, the second wiring pattern BL may include copper (Cu). The second wiring pattern BL may be formed by, but is not limited thereto, for example, a damascene process.

As a result, since deterioration of the properties of the first memory cell MC1 is impeded/prevented, while providing the first wiring pattern WL1 having a low wiring resistance, a method for fabricating a semiconductor memory device having improved performance can be provided.

Figure 17:
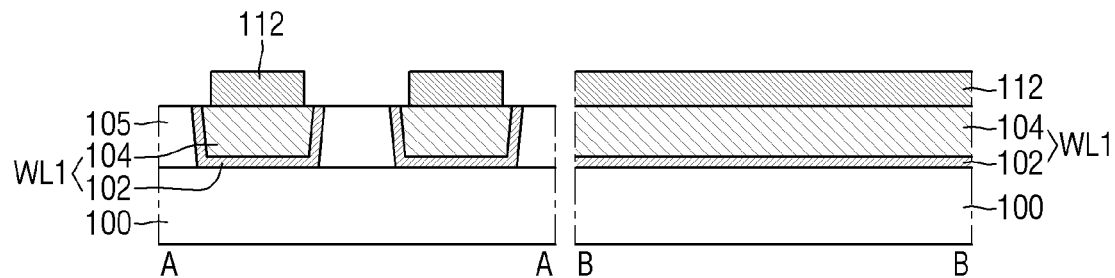
FIGS. 17 and 18 are intermediate stage diagrams for explaining a method for fabricating a semiconductor memory device according to some embodiments.
Figure 18:
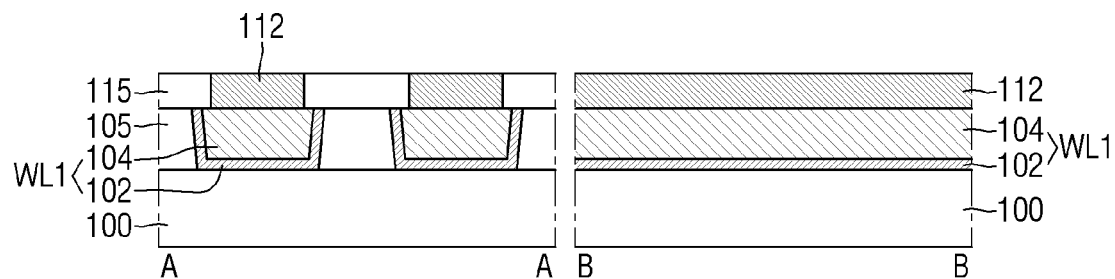

FIGS. 17 and 18 are intermediate stage diagrams for explaining a method for fabricating the semiconductor memory device according to some embodiments. For convenience of explanation, repeated parts of contents explained above using FIGS. 1 to 16 will be briefly explained or omitted. For reference, FIG. 17 is an intermediate stage diagram for explaining the step after FIG. 10.

Referring to FIG. 17, the first barrier conductive pattern 112 is formed on the first inter-wiring insulation film 105 and the first wiring pattern WL1.

For example, a conductive film that is on (e.g., that covers) the first inter-wiring insulation film 105 and the first wiring pattern WL1 may be formed. Subsequently, the conductive film may be patterned to form the first barrier conductive pattern 112 connected to the first wiring pattern WL1.

In some embodiments, the first barrier conductive pattern 112 may be patterned to extend long in the first direction Y. In some embodiments, the first barrier conductive pattern 112 may be patterned to provide a plurality of first barrier conductive patterns 112 that are spaced apart from each other in the first direction Y and the second direction X and arranged in a matrix form.

Referring to FIG. 18, the first barrier insulation film 115 is formed on the first inter-wiring insulation film 105 and the first wiring pattern WL1.

For example, an insulation film that is on (e.g., that covers) the first inter-wiring insulation film 105, the first wiring pattern WL1, and the first barrier conductive pattern 112 may be formed. Subsequently, a flattening process for exposing the first barrier conductive pattern 112 may be performed. As a result, the first barrier insulation film 115 that surrounds the side surfaces of the first barrier conductive pattern 112 may be formed.

FIGS. 19 to 22 are intermediate stage diagrams for explaining a method for fabricating a semiconductor memory device according to some embodiments. For convenience of explanation, repeated parts of contents explained above using FIGS. 1 to 18 will be briefly explained or omitted.

Figure 19:
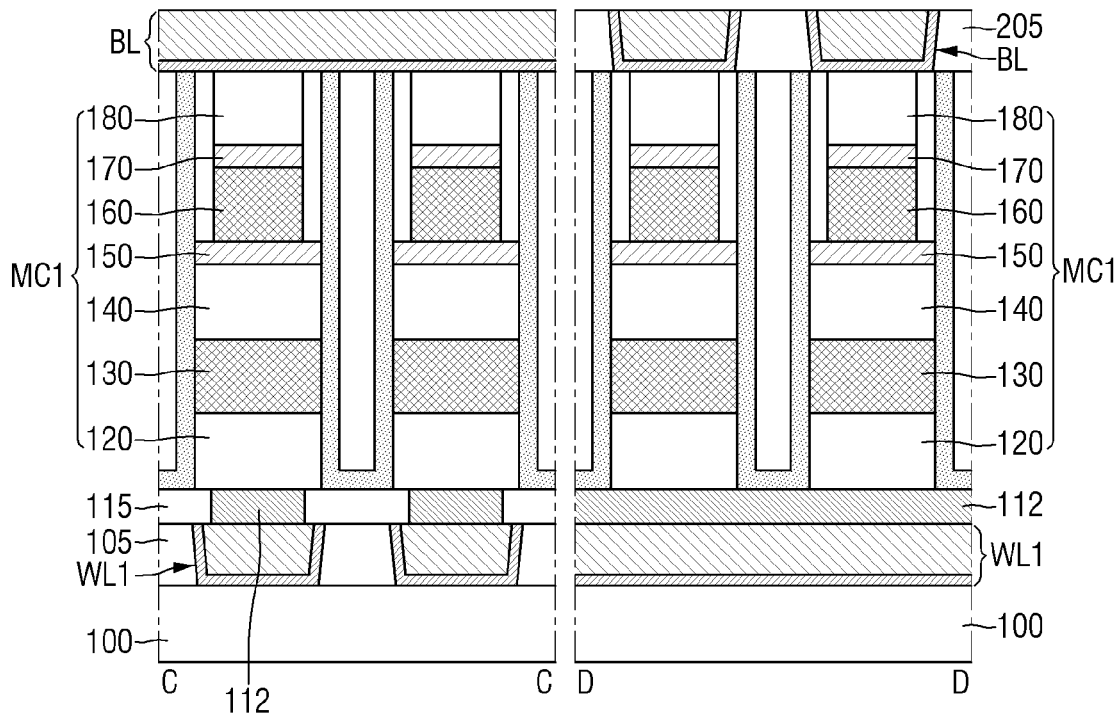
FIGS. 19 to 22 are intermediate stage diagrams for explaining a method for fabricating a semiconductor memory device according to some embodiments.

Referring to FIG. 19, the first inter-wiring insulation film 105, the first wiring pattern WL1, the first barrier insulation film 115, the first barrier conductive pattern 112, the first memory cell MC1, the second inter-wiring insulation film 205, and the second wiring pattern BL are formed on the substrate 100.

Since formation of the first inter-wiring insulation film 105, the first wiring pattern WL1, the first barrier insulation film 115, the first barrier conductive pattern 112, the first memory cell MC1, the second inter-wiring insulation film 205 and the second wiring pattern BL has been explained above using FIGS. 1, 2, and 10 to 18, detailed explanation thereof will not be provided below.

Figure 20:
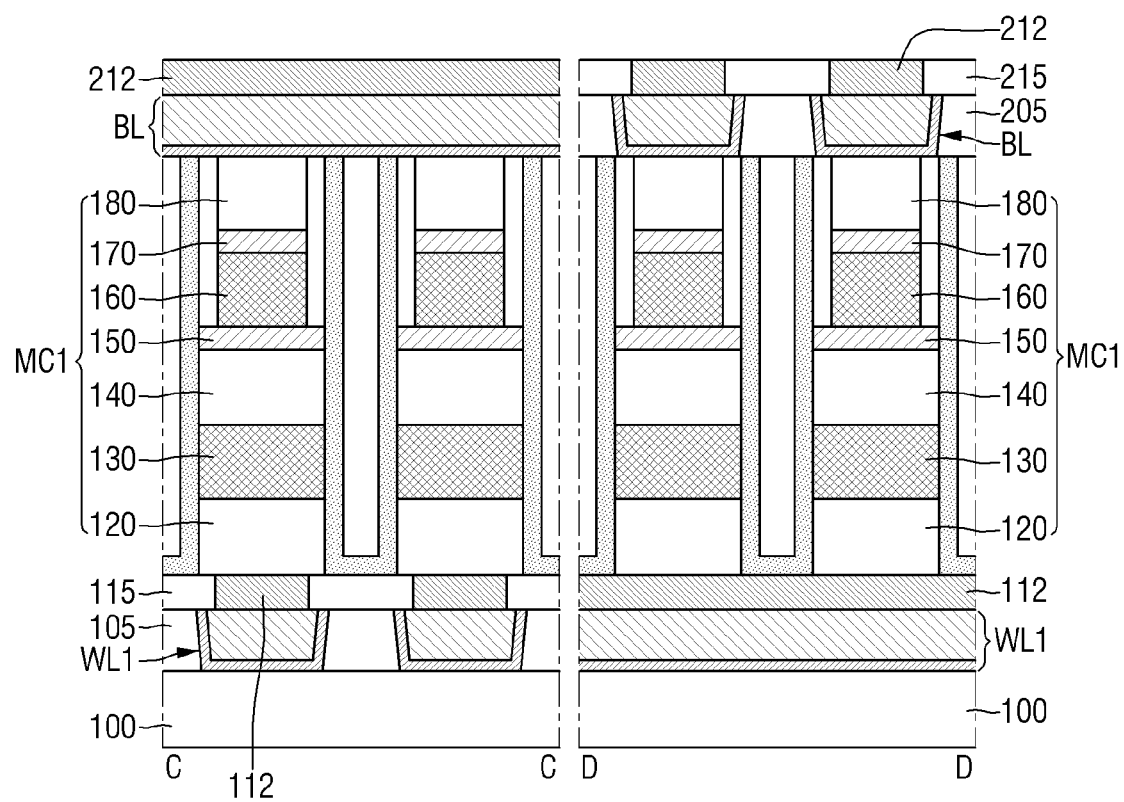

Referring to FIG. 20, the second barrier insulation film 215 and the second barrier conductive pattern 212 are formed on the second inter-wiring insulation film 205 and the second wiring pattern BL.

Since formation of the second barrier insulation film 215 and the second barrier conductive pattern 212 may be similar to formation of the first barrier insulation film 115 and the first barrier conductive pattern 112, detailed explanation thereof will not be provided below.

Figure 21:
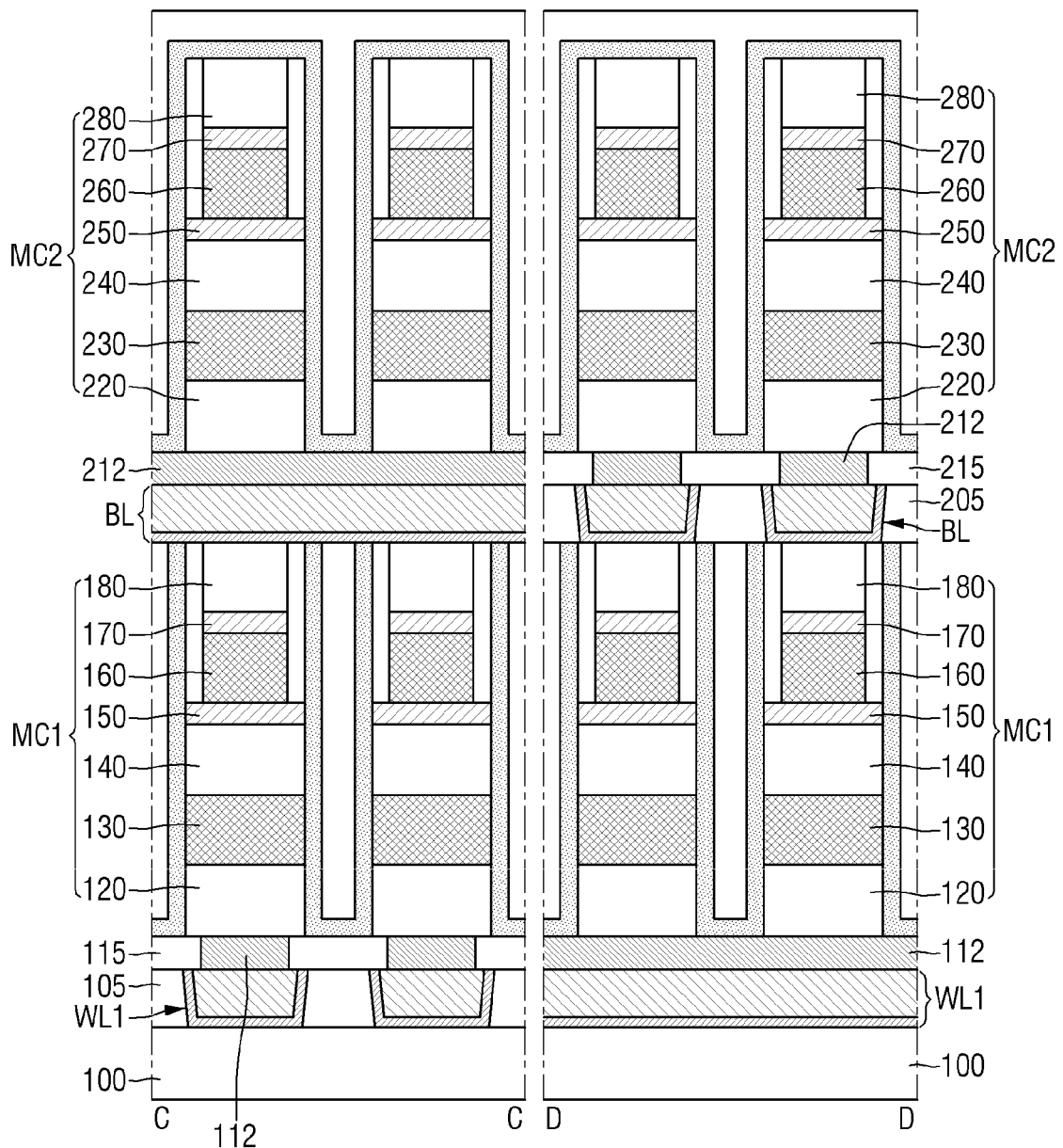

Referring to FIG. 21, a second memory cell MC2 is formed on the first barrier insulation film 115 and the first barrier conductive pattern 112.

Since formation of the second memory cell MC2 may be similar to formation of the first memory cell MC1, detailed explanation thereof will not be provided below.

Figure 22:
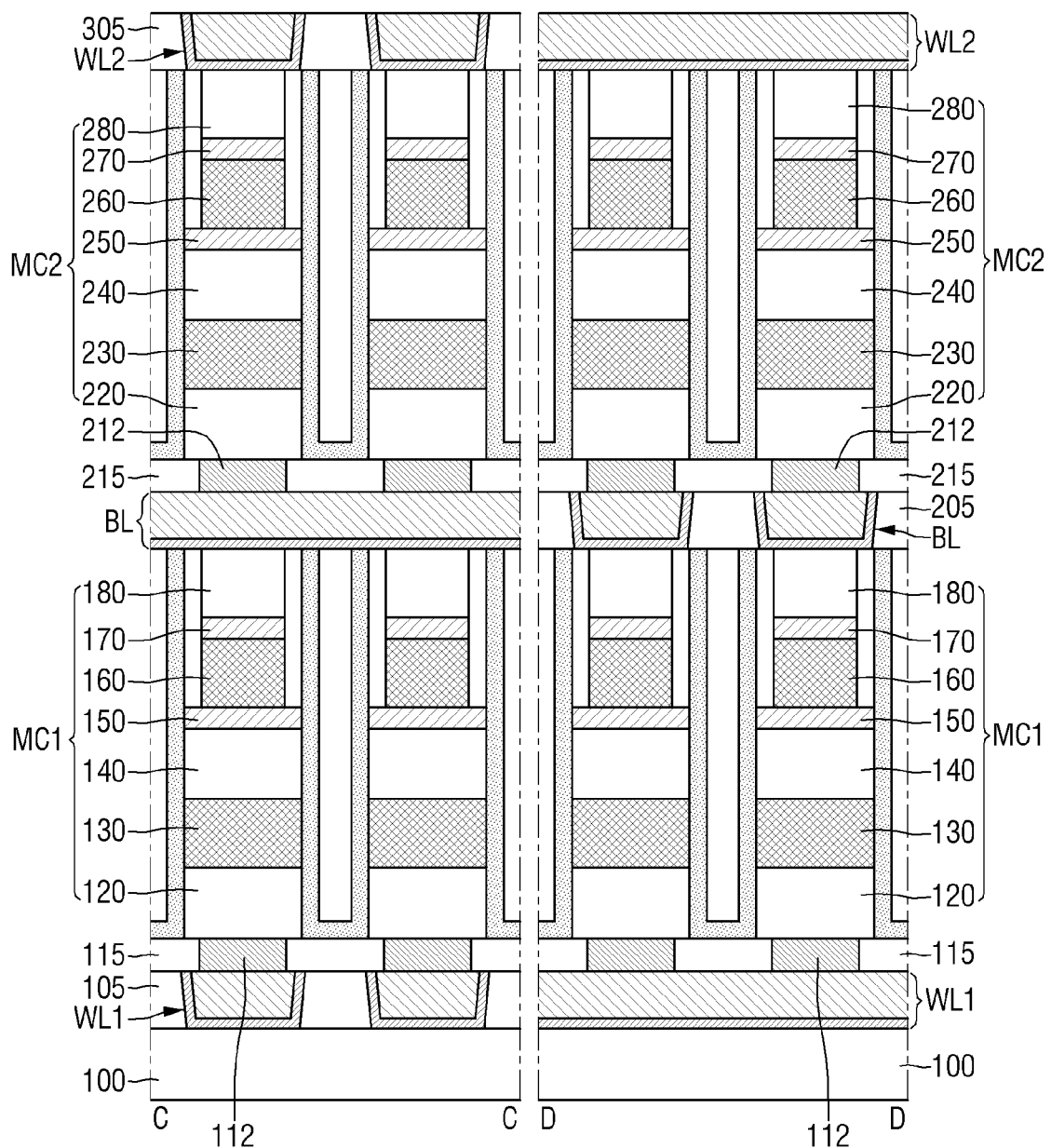

Referring to FIG. 22, a third inter-wiring insulation film 305 and a third wiring pattern WL2 are formed on the second memory cell MC2.

Since formation of the third inter-wiring insulation film 305 and the third wiring pattern WL2 may be similar to formation of the first inter-wiring insulation film 105 and the first wiring pattern WL1, detailed explanation thereof will not be provided below.

Subsequently, referring to FIG. 8, the third barrier insulation film 315 and the third barrier conductive pattern 312 are formed on the second memory cell MC2.

Since formation of the third barrier insulation film 315 and the third barrier conductive pattern 312 may be similar to formation of the first barrier insulation film 115 and the first barrier conductive pattern 112, detailed explanation thereof will not be provided below.

Accordingly, it is possible to provide a semiconductor memory device that includes a cross point memory cell array.

In concluding the detailed description, those skilled in the art will appreciate that many variations and modifications may be made to the example embodiments without substantially departing from the scope of the present invention. Therefore, the disclosed example embodiments of the disclosure are used in a generic and descriptive sense only and not for purposes of limitation.

What is claimed is:

1. A semiconductor memory device comprising:
   an inter-wiring insulation film on a substrate;
   a word line extending in a first direction, in the inter-wiring insulation film;
   a barrier insulation film that is on an upper surface of the inter-wiring insulation film;
   a barrier conductive pattern electrically connected to the word line, in the barrier insulation film;
   a memory cell electrically connected to the barrier conductive pattern and including a lower electrode pattern that is in direct contact with the barrier conductive pattern, a selection pattern on the lower electrode pattern, and a variable resistor pattern on the selection pattern; and
   a second wiring pattern extending in a second direction intersecting the first direction, on the memory cell,
   wherein a width of the barrier conductive pattern in the second direction is different from a width in the second direction of the lower electrode pattern and is different from a width in the second direction of the word line, and wherein the lower electrode pattern comprises a metal, a metal nitride, or a combination thereof.

2. The semiconductor memory device of claim 1, wherein an upper surface of the barrier insulation film and an upper surface of the barrier conductive pattern are coplanar.

3. The semiconductor memory device of claim 1, further comprising:
a protective film that extends along an upper surface of the barrier insulation film and side surfaces of the memory cell.

4. The semiconductor memory device of claim 1, wherein the barrier insulation film and the barrier conductive pattern are equally thick in a third direction that intersects the first direction and the second direction.

5. The semiconductor memory device of claim 1,
wherein the barrier insulation film includes a hole extending in a third direction intersecting an upper surface of the substrate,
wherein the barrier conductive pattern is in the hole, and
wherein an upper surface of the barrier conductive pattern is in contact with a lower surface of the memory cell.

6. The semiconductor memory device of claim 1, wherein the width of the barrier conductive pattern in the second direction decreases toward the substrate.

7. The semiconductor memory device of claim 1, wherein the width of the barrier conductive pattern in the second direction is smaller than the width of the memory cell in the second direction.

8. The semiconductor memory device of claim 1,
wherein the barrier insulation film includes at least one of silicon nitride (SiN), silicon carbonitride (SiCN), or aluminum nitride (AlN), and
wherein the barrier conductive pattern includes at least one of titanium nitride (TiN), tantalum nitride (TaN), tantalum (Ta), tungsten nitride (WN), tungsten carbonitride (WCN), or tungsten (W).

9. The semiconductor memory device of claim 1, wherein the word line includes copper (Cu).

10. The semiconductor memory device of claim 9, wherein the word line further includes:
a filling conductive film including copper (Cu); and
a barrier conductive film between the inter-wiring insulation film and the filling conductive film.

11. The semiconductor memory device of claim 1, wherein a width of the word line in the second direction decreases toward the substrate.

12. The semiconductor memory device of claim 1,
wherein the variable resistor pattern is a phase change pattern in which resistance changes depending on a phase change, and
wherein the selection pattern has ovonic threshold switching (OTS) properties.

13. The semiconductor memory device of claim 1,
wherein the selection pattern and the variable resistor pattern are on the barrier conductive pattern, and
wherein the selection pattern is between the variable resistor pattern and the barrier conductive pattern.

14. A semiconductor memory device comprising:
an inter-wiring insulation film on a substrate;
a first wiring pattern extending in a first direction, in the inter-wiring insulation film;
a barrier insulation film that is on an upper surface of the inter-wiring insulation film;
a barrier conductive pattern electrically connected to the first wiring pattern, in the barrier insulation film;
a memory cell on the barrier conductive pattern, the memory cell including a selection pattern, a variable resistor pattern, a lower electrode pattern between the barrier conductive pattern and the selection pattern, and an upper electrode pattern on the variable resistor pattern;
a protective film that extends along an upper surface of the barrier insulation film and side surfaces of the memory cell;
a second wiring pattern that extends in a second direction intersecting the first direction, on the memory cell; and
a spacer film that is on an upper surface of the selection pattern and is between a side surface of the protective film and a side surface of the upper electrode pattern, and
wherein the lower electrode pattern comprises a metal, a metal nitride, or a combination thereof.

15. The semiconductor memory device of claim 14, wherein:
the spacer film extends along surfaces of the variable resistor pattern, between the variable resistor pattern and the protective film.

16. The semiconductor memory device of claim 15, wherein the spacer film does not extend along side surfaces of the selection pattern.

17. The semiconductor memory device of claim 16, wherein a width of the selection pattern in the second direction is greater than a width of the variable resistor pattern in the second direction.

18. The semiconductor memory device of claim 14,
wherein the inter-wiring insulation film includes silicon oxide, and
wherein the barrier insulation film includes silicon nitride.

19. A semiconductor memory device comprising:
a first word line and a second word line that are on a substrate and each extend in a first direction, wherein the first word line is between the second word line and the substrate;
a bit line that extends in a second direction intersecting the first direction, between the first word line and the second word line;
a first barrier conductive pattern electrically connected to an upper surface of the first word line;
a first barrier insulation film that surrounds side surfaces of the first barrier conductive pattern;
a first memory cell that electrically connects the first barrier conductive pattern and the bit line, on an upper surface of the first barrier conductive pattern and an upper surface of the first barrier insulation film;
a second barrier conductive pattern electrically connected to an upper surface of the bit line;
a second barrier insulation film that surrounds side surfaces of the second barrier conductive pattern; and
a second memory cell that electrically connects the second barrier conductive pattern and the second word line, on an upper surface of the second barrier conductive pattern and an upper surface of the second barrier insulation film,
wherein each of the first memory cell and the second memory cell includes a selection pattern having ovonic threshold switching (OTS) properties and a phase change pattern in which resistance changes depending on a phase change.

20. The semiconductor memory device of claim 19,
wherein each of the first memory cell and the second memory cell further includes:
- a lower electrode pattern between the first barrier conductive pattern and the selection pattern;
- a central electrode pattern between the selection pattern and the phase change pattern; and
- an upper electrode pattern on the central electrode pattern, and wherein the phase change pattern is between the upper electrode pattern and the central electrode pattern.

* * * * *